(12) United States Patent
Takaki et al.

(10) Patent No.: US 9,964,602 B2
(45) Date of Patent: May 8, 2018

(54) MAGNETIC SENSOR

(71) Applicant: HITACHI METALS, LTD., Tokyo (JP)

(72) Inventors: Yasunori Takaki, Mishima-gun (JP); Makoto Kawakami, Mishima-gun (JP); Yasunori Abe, Mishima-gun (JP)

(73) Assignee: HITACHI METALS, LTD., Tokyo (JP)

( * ) Notice: Subject to any disclaimer, the term of this patent is extended or adjusted under 35 U.S.C. 154(b) by 281 days.

(21) Appl. No.: 14/777,877

(22) PCT Filed: Mar. 17, 2014

(86) PCT No.: PCT/JP2014/057152
§ 371 (c)(1),
(2) Date: Sep. 17, 2015

(87) PCT Pub. No.: WO2014/148437
PCT Pub. Date: Sep. 25, 2014

(65) Prior Publication Data
US 2016/0274196 A1 Sep. 22, 2016

(30) Foreign Application Priority Data

Mar. 18, 2013 (JP) .................................. 2013-055449

(51) Int. Cl.
*G01R 33/02* (2006.01)
*G01R 33/00* (2006.01)
(Continued)

(52) U.S. Cl.
CPC ....... *G01R 33/0041* (2013.01); *G01R 33/093* (2013.01); *H01L 27/22* (2013.01); *H01L 43/08* (2013.01)

(58) Field of Classification Search
CPC .......................... G01R 33/0093; G01R 33/093
(Continued)

(56) References Cited

U.S. PATENT DOCUMENTS 4,361,805 A * 11/1982 Narimatsu ............. G01D 5/145
  324/207.21
9,678,177 B2 * 6/2017 Kawakami ........... G01R 33/093
(Continued)

FOREIGN PATENT DOCUMENTS

JP 2003-202365 A 7/2003
JP 2011-196798 A 10/2011
(Continued)

OTHER PUBLICATIONS

International Preliminary Report on Patentability dated Sep. 22, 2015 in counterpart application No. PCT/JP2014/057152.
(Continued)

*Primary Examiner* — Reena Aurora
(74) *Attorney, Agent, or Firm* — Sughrue Mion, PLLC

(57) ABSTRACT

A magnetic sensor includes: a first current line, a second current line and a third current line that are disposed in parallel to each other in sequence in a width direction and electrically connected in series; and a magnetoresistive effect element disposed under the second current line and extending along a direction of extension of the second current line, the magnetoresistive effect element having an electric resistance that changes by an induced magnetic field generated by current flowing through the first current line, the second current line and the third current line, the following inequality expression (1) being satisfied:

$$L_s/W_g \leq 5 \tag{1}$$

where $L_s$ is a length from an outside of the first current line to an outside of the third current line in a width direction, and $W_g$ is a length in the width direction of the magnetoresistive effect element.

16 Claims, 28 Drawing Sheets

(51) Int. Cl.
*H01L 43/08* (2006.01)
*H01L 27/22* (2006.01)
*G01R 33/09* (2006.01)

(58) Field of Classification Search
USPC .......................................................... 324/252
See application file for complete search history.

(56) References Cited

U.S. PATENT DOCUMENTS

| | | |
|---|---|---|
| 2003/0094944 A1 | 5/2003 | Suzuki et al. |
| 2006/0145690 A1* | 7/2006 | Shoji ...................... B82Y 25/00 |
| | | 324/207.21 |
| 2006/0152862 A1* | 7/2006 | Nakatani ................ B82Y 10/00 |
| | | 360/324.2 |
| 2011/0221436 A1 | 9/2011 | Ichinohe et al. |
| 2011/0227560 A1 | 9/2011 | Haratani et al. |
| 2012/0062215 A1 | 3/2012 | Ide et al. |
| 2013/0127456 A1 | 5/2013 | Hebiguchi |

FOREIGN PATENT DOCUMENTS

| | | |
|---|---|---|
| WO | 2010/143666 A1 | 12/2010 |
| WO | 2011/111493 A1 | 9/2011 |
| WO | 2012026255 A1 | 3/2012 |
| WO | 2013/018665 A1 | 2/2013 |

OTHER PUBLICATIONS

International Search Report of PCT/JP2014/057152 dated Jun. 17, 2014.

* cited by examiner

IN THE CASE OF CONSTANT CURRENT

IN THE CASE OF CONSTANT VOLTAGE(1)

IN THE CASE OF CONSTANT VOLTAGE(2)

MAGNETIC SENSOR

CROSS REFERENCE TO RELATED APPLICATIONS

This is a National Stage of International Application No. PCT/JP2014/057152 filed Mar. 17, 2014 (claiming priority based on Japanese Patent Application No. 2013-055449 filed Mar. 18, 2013), the contents of all of which are incorporated herein by reference in their entirety.

TECHNICAL FIELD

The present invention relates to a magnetic sensor and, more particularly, to a magnetic sensor employing a magnetoresistive effect element.

BACKGROUND ART

Magnetic sensors have been used for noncontact measurement of current in many technical fields, including the current control for hybrid cars and electric vehicles, charge and discharge control of a battery, power converters in the power electronics field, and smart grids, or for measurement of magnetic field strength of a throttle position, an accelerator position, the torque of an electric power steering system, etc.

Such a magnetic sensor is known to include a magnetic core (magnetic core with a C-shape) with a ring-like shape to enclose a conductor, such as a current line, with a gap formed in part of the ring-like shape, a magnetic detection element, such as a Hall element, disposed in the gap, and a winding (coil) around the magnetic core.

In the magnetic sensor, a magnetic field that is induced in the magnetic core by flowing current through the conductor is detected by the magnetic detection element placed in the gap. A feedback current is allowed to pass through the wiring in order to set the magnetic field in the magnetic core to zero. The feedback current value is converted into a voltage by means of a detected resistance. By using the voltage value, the magnitude of the current passing through the conductor is determined.

In the magnetic sensor with the above-mentioned magnetic core, however, the magnetic core is formed to enclose the conductor, generating a large induced magnetic field in the magnetic core itself. Thus, the amount of current flowing as feedback current increases, disadvantageously resulting in increased power consumption.

For this reason, for example, devices supplied with current from the batteries have various problems, including reduced usable time in a battery after each charge.

On the other hand, for example, as mentioned in Patent Document 1, there is a known magnetic sensor (current sensor) that includes a planar coil with a linear portion having a plurality of current lines arranged in parallel, each of which extends linearly, and one, or two or more magnetoresistive effect element(s) extending in the same direction as that in which the current lines of the linear portion extend.

The magnetic sensor employing this magnetoresistive effect element is designed to detect part (part of the loop in the circumferential direction enclosing the conductor to be measured) of the induced magnetic field generated by the current (detection target current) flowing through the conductor to be measured by means of the magnetoresistive effect element. Then, the magnetic sensor allows a feedback current to flow through the current lines (planar coil) to cancel the detected magnetic field (to apply a magnetic field to the magnetoresistive effect element, the applied magnetic field having identical magnitude and opposite direction to the external magnetic field applied to the magnetoresistive effect element by means of the current to be detected). Based on the magnitude of the feedback current, the magnetic sensor determines the magnitude of the current to be detected.

A magnetic sensor with the structure mentioned above has the advantage of low power consumption compared to the above related art magnetic sensor, which includes a magnetic core enclosing the conductor to be measured.

Patent Document 1: JP 2011-196798 A

DISCLOSURE OF THE INVENTION

Problems to be Solved by the Invention

However, there have been increasing demands for reduction in size and weight of various devices. For example, the need arises for a battery having a smaller size and capacity, while maintaining the same lifetime and number of usable times as the conventional batteries when being fully charged. Further, a battery of the same type as the conventional ones is still required to have a longer lifetime or increased number of the usable times when fully charged in use. Furthermore, energy savings are increasingly demanded for devices that employ commercial power sources, even without the use of batteries.

All of these requirements mean that magnetic sensors functioning with the lower power consumption are needed.

Accordingly, it is an object of the present invention to provide a magnetic sensor that operates with the lower power consumption, particularly, with the lower feedback current.

Means for Solving the Problem

The inventors have found a system that practically drives one magnetoresistive effect element by using the induced magnetic field generated by a plurality of current lines connected in series, which system is not a system that drives one magnetoresistive effect element by using the induced magnetic field generated by only one current line closest to the magnetoresistive effect element. Based on these findings, the inventors have achieved the present invention.

A first aspect of the present invention is directed to a magnetic sensor which includes: a first current line, a second current line and a third current line that are disposed in parallel to each other in sequence in a width direction and electrically connected in series; and a magnetoresistive effect element disposed under the second current line and extending along a direction of extension of the second current line, the magnetoresistive effect element having an electric resistance that changes by an induced magnetic field generated by current flowing through the first current line, the second current line and the third current line, following inequality expression (1) being satisfied:

$$L_s/W_g \leq 5 \qquad (1)$$

where $L_s$ is a length from an outside of the first current line to an outside of the third current line in a width direction, and $W_g$ is a length in the width direction of the magnetoresistive effect element.

A second aspect of the present invention is directed to the magnetic sensor according to the first aspect in which following inequality expression (2) is satisfied:

$$W_p \leq W_g \qquad (2)$$

where $W_p$ is a length in the width direction of the second current line, and $W_g$ is the length in the width direction of the magnetoresistive effect element.

A third aspect of the present invention is directed to the magnetic sensor according to the first or second aspect in which a plurality of the magnetoresistive effect elements is disposed.

A fourth aspect of the present invention is directed to the magnetic sensor according to anyone of the first to third aspects in which the first current line, the second current line and the third current line are parts of a planar coil.

A fifth aspect of the present invention is directed to the magnetic sensor according to any one of the first to fourth aspects in which a yoke layer is disposed over the first current line, the second current line and the third current line to cover the first current line, the second current line and the third current line.

A sixth aspect of the present invention is directed to the magnetic sensor according to anyone of the first to fifth aspects in which each of the first current line, the second current line and the third current line is formed vertically in two or more layers.

A seventh aspect of the present invention is directed to the magnetic sensor according to any one of the first to sixth aspects, which further includes a plurality of bias-magnetic-field applying current lines extending in a direction vertical to the direction of extension of the second current line, the bias-magnetic-field applying current lines being adapted to apply a bias magnetic field to the magnetoresistive effect element by an induced magnetic field generated by a flowing current.

An eighth aspect of the present invention is directed to the magnetic sensor according to the seventh aspect in which the plurality of bias-magnetic-field applying current lines is disposed above the first current line, the second current line and the third current line.

A ninth aspect of the present invention is directed to the magnetic sensor according to the seventh aspect in which the plurality of bias-magnetic-field applying current lines is disposed between the second current line and the magnetoresistive effect element.

A tenth aspect of the present invention is directed to the magnetic sensor according to the seventh aspect in which the plurality of bias-magnetic-field applying current lines is disposed below the first current line, the second current line and the third current line.

An eleventh aspect of the present invention is directed to the magnetic sensor according to any one of the first to tenth aspects in which the magnetoresistive effect element is a spin valve giant magnetoresistive effect element.

A twelfth aspect of the present invention is directed to the magnetic sensor according to any one of the first to eleventh aspects, which further includes: a fourth current line extending in parallel to the first current line and disposed outside the first current line; a fifth current line extending in parallel to the third current line and disposed outside the third current line; a first yoke layer disposed below the fourth current line, containing a soft magnetic material, and not electrically connected to the first to fifth current lines and the magnetoresistive effect element; and a second yoke layer disposed below the fifth current line, containing a soft magnetic material, and not electrically connected to the first to fifth current lines and the magnetoresistive effect element.

A thirteenth aspect of the present invention is directed to the magnetic sensor according to any one of the first to twelfth aspects in which the two or more magnetoresistive effect elements are disposed to be electrically connected together so as to form a bridge circuit.

A fourteenth aspect of the present invention is directed to the magnetic sensor according to the thirteenth aspect in which the bridge circuit is a half-bridge circuit.

A fifteenth aspect of the present invention is directed to the magnetic sensor according to the thirteen aspect in which the four or more magnetoresistive effect elements are disposed, and the bridge circuit is a full bridge circuit using the four or more magnetoresistive effect elements.

Effects of the Invention

The magnetic sensor according to the present invention is configured by optimizing the arrangement of the current lines allowing the feedback current to flow therethrough and the magnetoresistive effect element having its electric resistance that changes depending on the induced magnetic field (feedback magnetic field) generated by the current flowing through the current lines. Thus, the present invention can provide the magnetic sensor that operates with the lower power consumption.

BRIEF DESCRIPTION OF THE DRAWINGS

FIGS. 1A to 1C are diagrams showing one current line 20 for allowing a feedback current to flow therethrough and a magnetoresistive effect element 10, in which FIG. 1A is a perspective view, FIG. 1B is a cross-sectional view, and FIG. 1C is a plan view.

FIGS. 12A to 12C show a magnetic sensor 120 according to modification of the first embodiment mentioned above, in which FIG. 12A is a top view of the magnetic sensor 120, FIG. 12B is an enlarged top view of a linear portion B of the planar coil 70 shown in FIG. 12A, and FIG. 12C is a cross-sectional view taken along the line 2c-2c of FIG. 12B.

FIGS. 13A to 13C show a magnetic sensor 130 according to a second embodiment of the present invention, in which FIG. 13A is a top view of the magnetic sensor 130, FIG. 13B is an enlarged top view of a linear portion B of the planar coil 70 shown in FIG. 13A, and FIG. 13C is a cross-sectional view taken along the line 3c-3c of FIG. 13B.

FIGS. 15A to 15C show a magnetic sensor 140 according to a third embodiment of the present invention, in which FIG. 15A is a top view of the magnetic sensor 140, FIG. 15B is an enlarged top view of a linear portion B of the planar coil 70 shown in FIG. 15A, and FIG. 15C is a cross-sectional view taken along the line 4c-4c of FIG. 15B.

FIGS. 17A to 17C show a magnetic sensor 150 according to a fourth embodiment of the present invention, in which FIG. 17A is a top view of the magnetic sensor 150, FIG. 17B is an enlarged top view of a linear portion B of the planar coil 70 shown in FIG. 17A, and FIG. 17C is a cross-sectional view taken along the line 5c-5c of FIG. 17B.

FIGS. 18A and 18B show a magnetic sensor 160 according to modification of the fourth embodiment, in which FIG. 18A is a top view of the magnetic sensor 160, FIG. 18B is an enlarged top view of a linear portion B of the planar coil 70 shown in FIG. 18A.

FIGS. 19A to 19C show a magnetic sensor 170 according to a fifth embodiment of the present invention, in which FIG. 19A is a top view of the magnetic sensor 170, FIG. 19B is an enlarged top view of a linear portion B of the planar coil 70 shown in FIG. 19A, and FIG. 19C is a cross-sectional view taken along the line 7c-7c of FIG. 19B.

FIGS. 20A to 20C show a magnetic sensor 180 according to a sixth embodiment of the present invention, in which FIG. 20A is a top view of the magnetic sensor 180, FIG. 20B is an enlarged top view of a linear portion B of the planar coil 70 shown in FIG. 20A, and FIG. 20C is a cross-sectional view taken along the line 8c-8c of FIG. 20B.

FIGS. 21A to 21C show a magnetic sensor 190 according to modification of the sixth embodiment, in which FIG. 21A is a top view of the magnetic sensor 190, FIG. 21B is an enlarged top view of a linear portion B of the planar coil 70 shown in FIG. 21A, and FIG. 21C is a cross-sectional view taken along the line 9c-9c of FIG. 21B.

FIGS. 22A to 22C show a magnetic sensor 200 according to a seventh embodiment of the present invention, in which FIG. 22A is a top view of the magnetic sensor 200, FIG. 22B is an enlarged top view of a linear portion B of the planar coil 70 shown in FIG. 22A, and FIG. 22C is a cross-sectional view taken along the line 10c-10c of FIG. 22B.

FIGS. 23A to 23C show a magnetic sensor 210 according to modification of the seventh embodiment of the present invention, in which FIG. 23A is a top view of the magnetic sensor 210, FIG. 23B is an enlarged top view of a linear portion B of the planar coil 70 shown in FIG. 23A, and FIG. 23C is a cross-sectional view taken along the line 11c-11c of FIG. 23B.

FIGS. 24A to 24C show a magnetic sensor 220 according to an eighth embodiment of the present invention, in which FIG. 24A is a top view of the magnetic sensor 220, FIG. 24B is an enlarged top view of a linear portion B of the planar coil 70 shown in FIG. 24A, and FIG. 24C is a cross-sectional view taken along the line 12c-12c of FIG. 24B.

FIGS. 25A to 25C show a magnetic sensor 230 according to modification of the eighth embodiment, in which FIG. 25A is a top view of the magnetic sensor 230, FIG. 25B is an enlarged top view of a linear portion B of the planar coil 70 shown in FIG. 25A, and FIG. 25C is a cross-sectional view taken along the line 13c-13c of FIG. 25B.

MODE FOR CARRYING OUT THE INVENTION

Figure 1A:
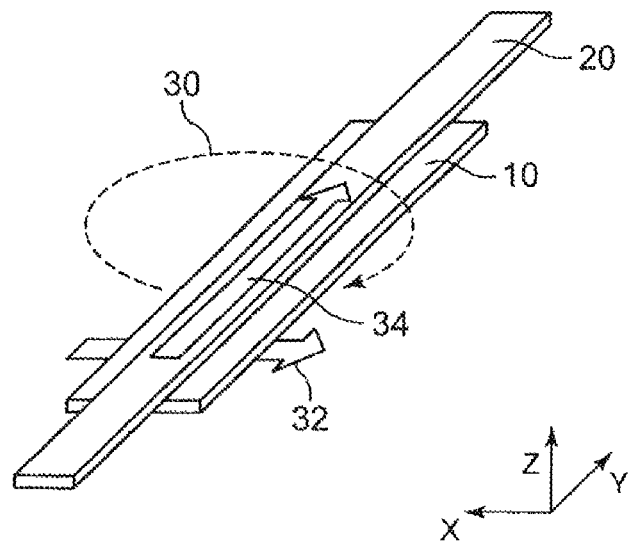

Preferred embodiments of the present invention will be described in detail with reference to the accompanying drawings. In the description below, if necessary, the terms indicative of the specific direction or position (for example, "upper", "lower", "right", "left", and other words including these words) are used for easy understanding of the present invention with reference to the drawings. The meanings of the terms are not intended to limit the technical range of the present invention. The same parts or members are designated by the same reference numerals throughout a plurality of drawings unless otherwise specified.

To easily understand the concept of the present invention, first, an outline of the mechanism for detecting magnetism and/or current by a magnetic sensor using a magnetoresistive effect element will be described with reference to FIGS. 1A to 1C and 2.

Figure 1B:
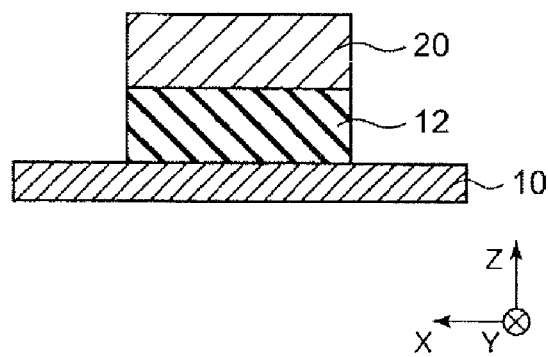
Figure 1C:
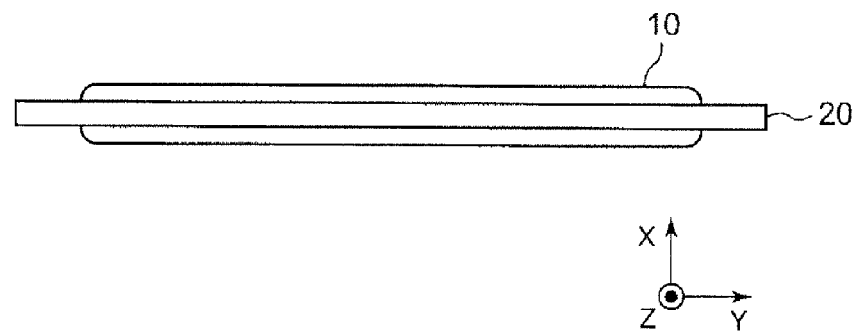
Figure 2:
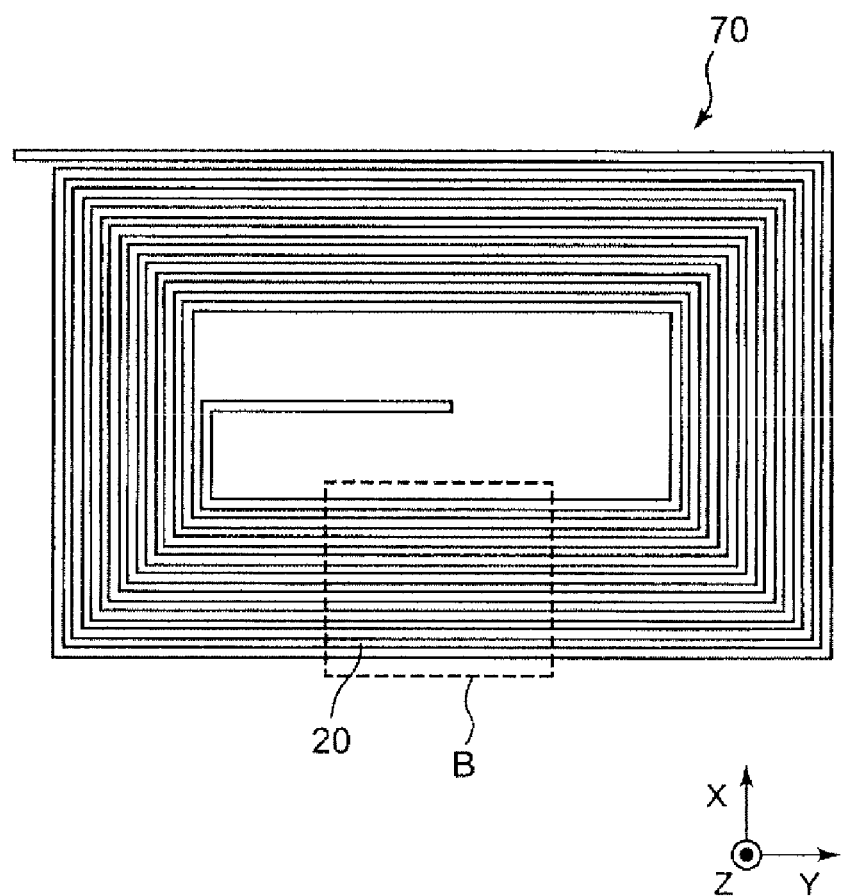
FIG. 2 is a plan view showing a planar coil 70 including the current line 20 shown in FIGS. 1A, 1B and 1C.

FIGS. 1A, 1B and 1C are diagrams showing one current line 20 for allowing a feedback current to flow therethrough and a magnetoresistive effect element 10, in which FIG. 1A is a perspective view, FIG. 1B is a cross-sectional view, and FIG. 1C is a plan view. FIG. 2 is a plan view showing a planar coil 70 including the current line 20 shown in FIGS. 1A, 1B and 1C.

As shown in FIG. 1 (hereinafter, the plurality of drawings designated by the same number followed by only different letters of the alphabet, like FIGS. 1A to 1C, are collectively indicated only by the number, like "FIG. 1" in some cases), the magnetoresistive effect element 10 is disposed under the current line 20 via an insulating layer 12 that is disposed as needed. The magnetoresistive effect element 10 extends in parallel with the direction in which the current line 20 extends (that is, the magnetoresistive effect element 10 extends along the direction in which the current line 20 extends). The magnetoresistive effect element 10 is an element having its electric resistance changed depending on the direction and strength of a magnetic field applied thereto from the outside (external magnetic field) The magnetoresistive effect element 10 is preferably a giant magnetoresistive effect element (GMR element), and more preferably, a spin valve giant magnetoresistive effect element (spin valve magnetic resistance (SVGMR element)).

The current line 20 is a conductor extending linearly. For example, the current line 20 is one conductor in a part (linear portion B shown in FIG. 2) comprised of a plurality of conductors extending in parallel to the long-side direction (in the Y direction) of the rectangular contour of the planar coil 70 in the planar view (as viewed in a −Z direction of FIG. 2) shown in FIG. 2.

The magnetoresistive effect element 10 and the current line 20 (for example, a coil 70) are connected to a feedback circuit (magnetic sensor circuit) not shown in FIGS. 1 and 2. As shown in FIG. 1A, the magnetoresistive effect element 10 changes its electric resistance when an external magnetic field 32 is applied to the magnetoresistive effect element 10, the external magnetic field 32 being part of the induced magnetic field generated by the conductor to be measured. Once the magnetoresistive effect element 10 changes its electric resistance, a feedback current 34 is supplied from a feedback circuit to the current line 20 so as to form a feedback magnetic field 30 that cancels the external magnetic field 32 (that is, with the same magnitude as and in a opposite direction from the external magnetic field 32).

The magnitude of the external magnetic field 32 can be determined by measuring the magnitude of the feedback current 34 (or the magnitude of the voltage for allowing the current 34 to flow). Then, based on the magnitude of the external magnetic field 32, the magnitude of the current flowing through the conductor to be measured can be determined.

Note that the term "external magnetic field" as used herein means the induced magnetic field that is created by the current (current to be measured) flowing through an object to be measured.

In the magnetic sensor that uses the magnetoresistive effect element 10 to enable measurement of the magnitude of the magnetic field and the magnitude of the current in accordance with such a measurement principle, the feedback current 34 contributes most of the power consumption of the entire sensor. For this reason, the reduction in feedback current leads to a decrease in power consumption of the entire sensor.

The inventors have found out the following and thus have made the present invention, as will be mentioned in detail later. In a magnetic sensor that includes three current lines 20 (a first current line, a second current line and a third current line in sequence) disposed in parallel to each other in sequence in the width direction and electrically connected in series; and the magnetoresistive effect element 10 that is disposed below the second current line (central current line) to extend along a direction parallel to the direction of extension of the second current line, the first to third current lines and the magnetoresistive effect element are arranged so as to satisfy the inequality expression (1) below, when $L_s$ is a length from the outside of the first current line to the outside of the third current line in the width direction (that is, $L_s$ is the total of a length of the first current line, a distance (clearance) between the first current line and the second current line, a length of the second current line, a distance between the second current line and the third current line, and a length of the third current line, in the width direction), and $W_g$ is a length in the width direction of the magnetoresistive effect element. Thus, a feedback magnetic field formed by the first current line and a feedback magnetic field formed by the third current line, in addition to the feedback magnetic field formed by the second current line, can be effectively applied to the magnetoresistive effect element. Therefore, the desired feedback magnetic field can be applied to the magnetoresistive effect element with low current.

$$L_s/W_g \leq 5 \quad (1)$$

The present invention will be described in detail below.

1. First Embodiment

1-1. Structure of Magnetic Sensor 100

Figure 3A:
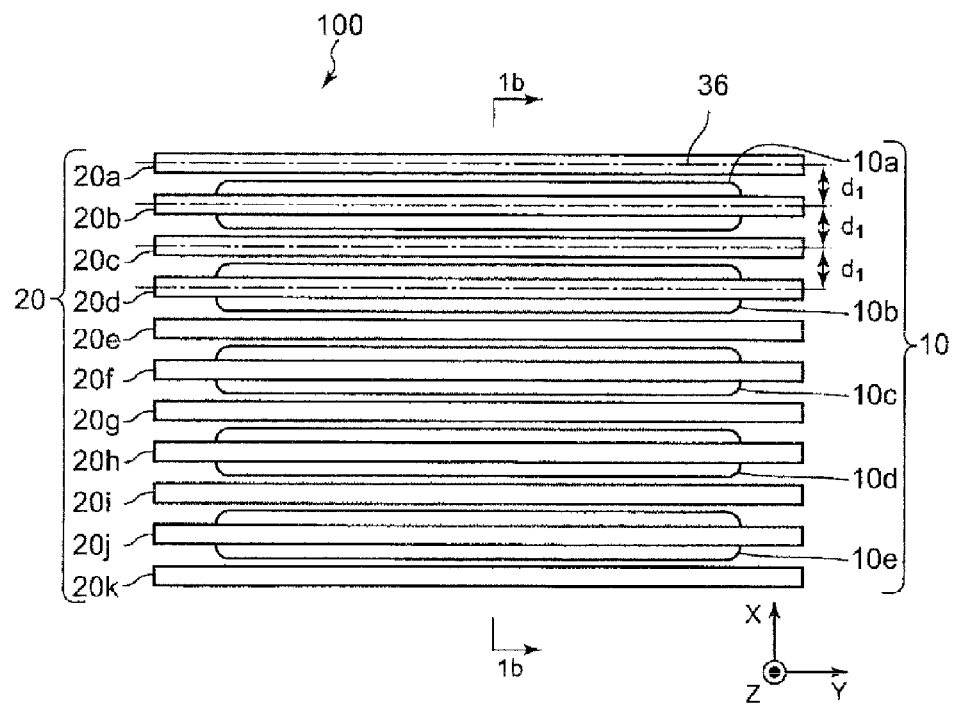
FIG. 3A is a top view of a magnetic sensor 100 according to a first embodiment of the present invention.
Figure 3B:
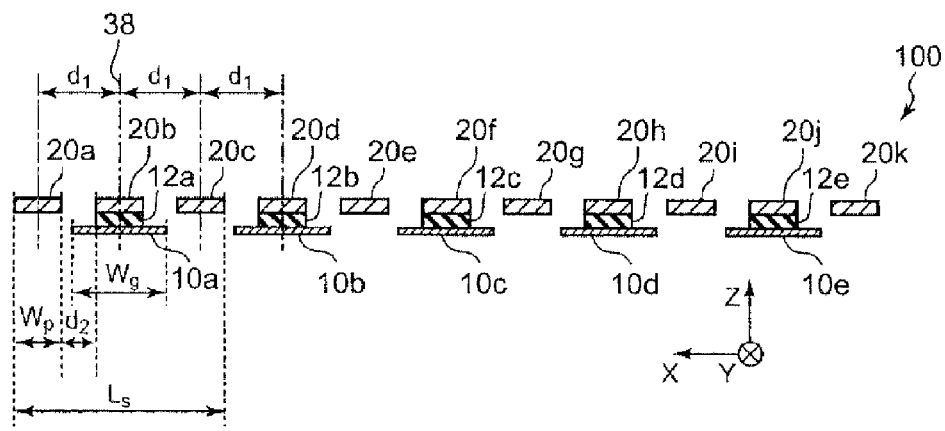
FIG. 3B is a cross-sectional view taken along the line 1b-1b of FIG. 3A.

FIG. 3A is a top view of a magnetic sensor 100 according to a first embodiment of the present invention, and FIG. 3B is a cross-sectional view taken along the line 1b-1b of FIG. 3A.

The magnetic sensor 100 includes a plurality of current lines 20 that extend in the same direction and are electrically connected in series. In one preferred embodiment, the current lines 20 constitute a linear portion B of a planar coil 70 shown in FIG. 2. This is because by applying a voltage between both ends of the planar coil, the feedback current can flow through all the current lines 20.

Although in the embodiment shown in FIG. 3A, eleven current lines 20 are disposed, any number of current lines 20 of equal to or more than three may be disposed.

Likewise, in the linear portion B of the planar coil 70 shown in FIG. 2, only seven current lines 20 are illustrated. By changing the number of winding the coil 70, the number of current lines 20 in the linear portion B may be set to any number equal to or more than three.

In FIG. 3, to individually identify the current lines 20, the respective current lines 20 are denoted by reference characters "20a" to "20k".

The magnetic sensor 100 includes one or more magnetoresistive effect elements 10. To detect the external magnetic field more accurately, the use of more magnetoresistive effect elements 10 is preferred. With a plurality of magnetosensitive axis directions, only a sensor chip including the magnetoresistive effect elements obtains a differential output without having an external resistor or the like. Thus, at least two or more magnetoresistive effect elements 10 are preferably disposed.

If other magnetoresistive effect elements 10 are disposed on both sides of the above-mentioned two magnetoresistive effect elements in a direction parallel to the extending direction of these two elements, the magnetic flux density of the magnetoresistive effect elements is amplified. For this reason, four or more magnetoresistive effect elements 10 are more preferably disposed. In the embodiment shown in FIG. 3, the magnetic sensor 100 includes five magnetoresistive effect elements 10.

The positional relationship between the magnetoresistive effect elements 10 and the current lines 20 will be described below with reference to FIG. 3. In FIG. 3, to individually identify the magnetoresistive effect elements, the respective magnetoresistive effect elements 10 are denoted by reference characters "10a" to "10e".

As shown in FIG. 3A, a current line (first current line) 20a, a current line (second current line) 20b, a current line (third current line) 20c, . . . a current line 20k are disposed in parallel with each other along their width direction (X direction). In the embodiment shown in FIG. 3, as shown in FIG. 3B, the current lines 20a to 20k each has a length of $W_p$ in the width direction (X direction). The adjacent current lines 20 are spaced apart from each other with a distance $d_2$ therebetween (a clearance between the current lines 20).

A magnetoresistive effect element 10a is disposed below the current line (second current line) 20b (under (or directly under) the current line in the height direction (in the Z direction of FIG. 3)) to have its extending direction in parallel to the extending direction of the current line 20b.

To ensure insulation between the current line 20(20b) and the magnetoresistive effect element 10 (10a), as shown in FIG. 3, an insulating layer 12(12a) may be disposed between the current line 20(20b) and the magnetoresistive effect element 10(10a).

The magnetoresistive effect element 10a has a length in the width direction (in the X direction) of $W_g$ (in the embodiment shown in FIG. 3, each of these other magnetoresistive effect elements 10b to 10e has the length in the width direction of $W_g$).

The length $L_s$ shown in FIG. 3B is a length in the width direction from the outside of the first current line 20a (in FIG. 3B, the left end of the first current line 20a) to the outside of the third current line (in FIG. 3B, the right end of the third current line 20c).

In other words, the length $L_s$ is the total of a length of the first current line 20a, a distance (clearance) between the first current line 20a and the second current line 20b, a length of the second current line 20b, a distance (clearance) between the second current line 20b and the third current line 20c, and a length of the third current line 20c, in the width direction. In the embodiment shown in FIG. 3, $L_s$ satisfies the following equation: $L_s=3W_p+2d_2$.

The magnetic sensor 100 is configured such that the length $L_s$ and the length $W_g$ satisfy the inequality expression (1) below.

$$L_s/W_g \leq 5 \quad (1)$$

To satisfy the inequality expression (1) means that the magnetoresistive effect element 10a has the sufficient length in the width direction as compared to the length of each of the current lines 20 (current lines 20a to 20c) in the width direction, whereby not only the feedback magnetic field created by the current line 20b positioned directly thereabove, but also the feedback magnetic fields created by the current lines 20a and 20c adjacent to both sides of the current line 20b can be effectively applied to the magnetoresistive effect element 10a.

Further, this also means that since the current lines 20a, 20b and 20c are connected together in series to permit the same current to flow therethrough in the same direction, the magnetic sensor 100 can apply the stronger feedback magnetic field to the magnetoresistive effect element 10 with a lower current amount than the case of allowing current to flow through one current line.

Preferably, the length $L_s$ and the length $W_g$ satisfy the inequality expression (1A) below. This is because the stronger feedback magnetic field can be surely applied to the magnetoresistive effect element 10 with lower current.

$$L_s/W_g \leq 3 \quad (1A)$$

Effects obtained by satisfying the inequality expressions (1) and (1A) will be clarified based on the simulation results to be mentioned later.

Preferably, the center of the length $L_s$ is aligned with the center of the length $W_g$ of the magnetoresistive effect element 10 (or the center in the width direction of the magnetoresistive effect element 10). This is because the magnetoresistive effect element 10 can be effectively subjected to the feedback magnetic fields from the first current line 20a and the third current line 20c that are positioned on both sides of the second current line 20b.

Preferably, the length $W_g$ in the width direction of the magnetoresistive effect element 10 and the length $W_p$ in the width direction of the current line 20 satisfy the following inequality expression (2). The inequality expression (2) means that the length in the width direction of the magnetoresistive effect element 10 is longer than that in the width direction of the current line 20 (especially, current line 20b). With this arrangement, a diamagnetic field within the magnetoresistive effect element 10 can be reduced to easily increase the sensitivity of the magnetoresistive effect element 10. Thus, a higher output can be obtained with the lower current consumption. To satisfy the inequality expression (2) means that the end in the width direction of the magnetoresistive effect element 10 is close to the first current line 20a or the third current line 20c. In this way, the feedback magnetic fields created by the current lines 20a and 20c can be surely applied to the magnetoresistive effect element 10.

$$W_p \leq W_g \quad (2)$$

Note that the form of the length $W_g$ of the magnetoresistive effect element 10 that satisfies the inequality expression (1) is not limited to that mentioned in the embodiment shown in FIG. 3B, and thus the length $W_g$ can take a plurality of forms.

FIG. 4 show cross-sectional views exemplifying the relationships between the length $L_s$ and the length $W_g$ of the magnetoresistive effect element 10. FIG. 4A shows the case of $W_g \leq W_p+2d_2$; FIG. 4B shows the case of $W_g \geq W_p+2d_2$; FIG. 4C shows the case of $W_g=L_s$; and FIG. 4D shows the case of $W_g > L_s$.

Figure 4A:
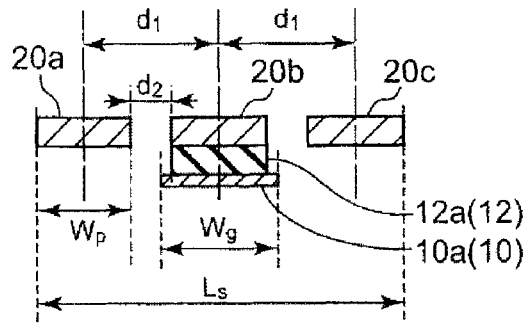
FIGS. 4A to 4D are cross-sectional views showing the relationships between a length $L_s$ and a length $W_g$ of the magnetoresistive effect element 10.

FIG. 4A shows the same situation as in the embodiment shown in FIG. 3B. The respective ends of the magnetoresistive effect element 10a (both ends) in terms of position in the width direction are positioned either between the first and second current lines 20a and 20b or between the second and third current lines 20b and 20c.

Figure 4B:
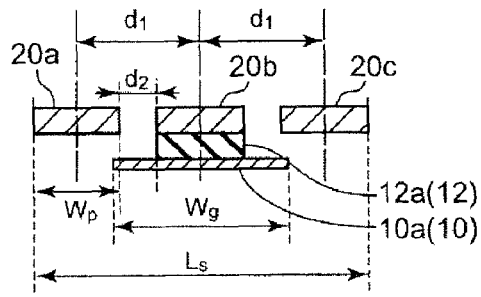

In the case of FIG. 4B, the respective ends (both ends) of the magnetoresistive effect element 10a overlap with either the first current line 20a or the third current line 20c, in terms of position in the width direction.

The embodiment shown in FIG. 4B can include the case of $W_g=2W_p$.

Figure 4C:
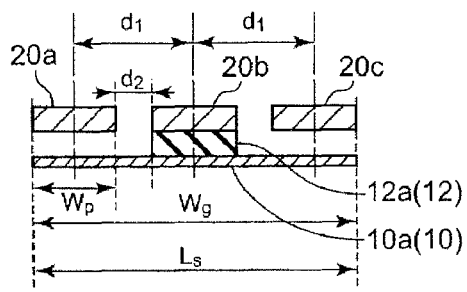

In the case of FIG. 4C, the ends (both ends) of the magnetoresistive effect element 10a are aligned with either the outer end of the first current line 20a (left end in FIG. 4C) or the outer end of the third current line 20c (right end in FIG. 4C), in terms of position in the width direction.

Figure 4D:
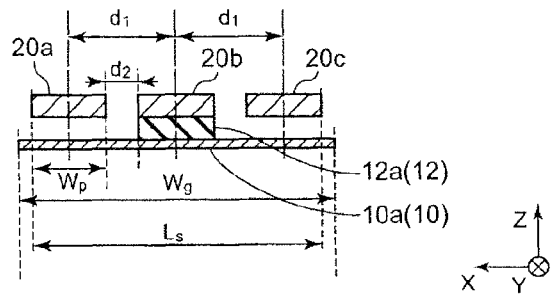

In the case of FIG. 4D, the ends (both ends) of the magnetoresistive effect element 10a are disposed outside either the outer end of the first current line 20a (left end in FIG. 4D) or the outer end of the third current line 20c (right end in FIG. 4D), in terms of position in the width direction.

In the embodiment shown in FIG. 3, further, a magnetoresistive effect element (second magnetoresistive effect element) 10b is disposed below the current line 20d via an insulating layer 12b to have its extending direction in parallel to the extending direction of the current line 20d. In this case, the first current line is the current line 20c, the second current line is the current line 20d, the third current line is the current line 20e, and the inequality expression (1) is satisfied.

Further, a magnetoresistive effect element (third magnetoresistive effect element) 10c is disposed below the current line 20f via an insulating layer 12c to have its extending direction in parallel to the extending direction of the current line 20f. In this case, the first current line is the current line 20e, the second current line is the current line 20f, the third current line is the current line 20g, and the inequality expression (1) is satisfied.

Furthermore, a magnetoresistive effect element (fourth magnetoresistive effect element) 10d is disposed below the current line 20h via an insulating layer 12d to have its extending direction in parallel to the extending direction of the current line 20h. In this case, the first current line is the current line 20g, the second current line is the current line 20h, the third current line is the current line 20i, and the inequality expression (1) is satisfied.

Moreover, a magnetoresistive effect element (fifth magnetoresistive effect element) 10e is disposed below the current line 20j via an insulating layer 12e to have its extending direction in parallel to the extending direction of the current line 20j. In this case, the first current line is the current line 20i, the second current line is the current line 20j, the third current line is the current line 20k, and the inequality expression (1) is satisfied.

In the embodiment shown in FIG. 3, for example, the current line 20c is defined as the third current line when the current line 20b with the magnetoresistive effect element 10*a* is defined as the second current line, while the current line 20*c* is also defined as the first current line when the current line 20*d* with the magnetoresistive effect element 10*b* disposed thereunder is defined as the second current line (the same goes for the current lines 20*e*, 20*g*, and 20*i*). In this way, one current line may serve as two of the first to third current lines.

For example, two or more current lines with no magnetoresistive effect element disposed thereunder may be respectively disposed between the current lines 20*b* and 20*d*, between the current lines 20*d* and 20*f*, between the current lines 20*f* and 20*h*, and between the current lines 20*h* and 20*j*, whereby these current lines may function only as any one of the first to third current lines.

The form of arrangement of a plurality of magnetoresistive effect elements 10 is not limited to that shown in FIG. 3. FIG. 5 are top views exemplifying the forms of arrangement of a plurality of magnetoresistive effect elements 10.

Figure 5A:
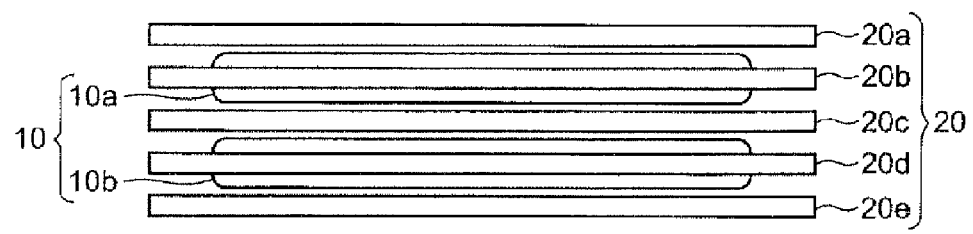
FIGS. 5A to 5C are top views showing the forms of arrangement of a plurality of magnetoresistive effect elements 10.

FIG. 5A shows the same form as that in FIG. 3. The magnetoresistive effect elements 10 are placed under every other current line among the current lines 20*a* to 20*d* arranged in sequence.

Figure 5B:
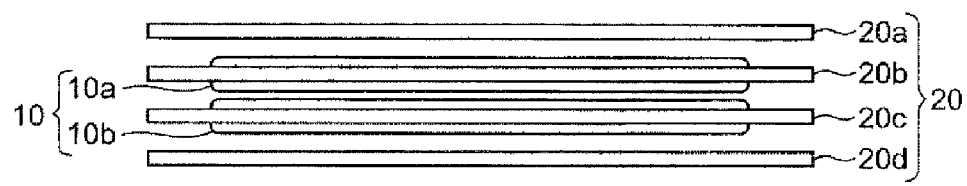

In FIG. 5B, the magnetoresistive effect elements 10 are disposed at both the adjacent current lines 20*b* and 20*c*. In this case, in the magnetoresistive effect element 10*a*, the current line 20*b* is defined as the second current line, and the current line 20*c* is defined as the third current line. In the magnetoresistive effect element 10*b*, the current line 20*c* is defined as the second current line, and the current line 20*b* is defined as the first current line.

Figure 5C:
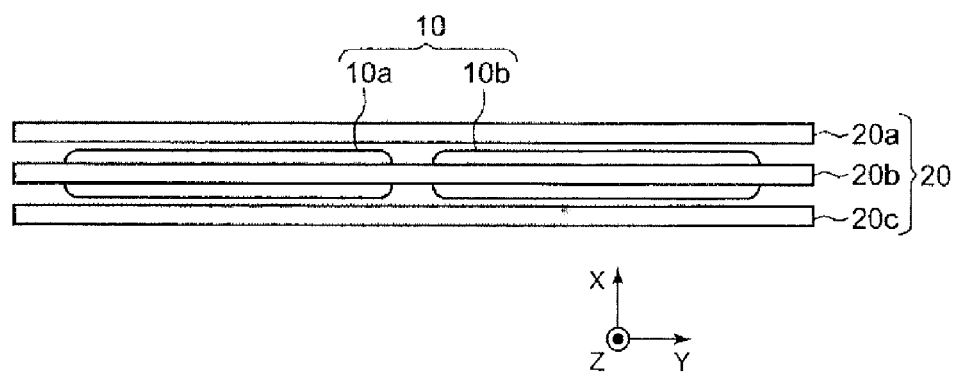

In FIG. 5C, a plurality of magnetoresistive effect elements 10 (in FIG. 5C, two magnetoresistive effect elements 10*a* and 10*b*) is disposed under one current line.

Any one of the embodiments shown in FIG. 5 can satisfy the inequality expression (1).

The current lines 20 (current lines 20*a* to 20*k*) shown in FIG. 3 have the same width $W_p$, as mentioned above and are arranged at equal intervals $d_1$. This form is preferred as the feedback magnetic field can be uniformly formed. However, the form of the current lines is not limited thereto. As long as the inequality expression (1) is satisfied, at least one of the lengths of the first, second and third current lines in the width direction may be different from that of others. Further, the distance between the first and second current lines may be different from that between the second and third current lines in the width direction.

As shown in FIG. 3, preferably, the center of the current line 20*b* in the width direction (in the X direction) (an alternate long and short dash line 36 passing through the current line 20*b* shown in FIG. 3A, and an alternate long and short dash line 38 passing through the current line 20*b* shown in FIG. 3B is aligned with the center of the magnetoresistive effect element 10*a* in the width direction (in the X direction) (that is, each of the alternate long and short dash lines 36 and 38 passing through the current line 20*b* is the central line in the width direction of the magnetoresistive effect element 10*a*.) This is because the feedback magnetic field generated by the current lines 20 is more uniformly applied to the magnetoresistive effect element 10*a*.

Likewise, the centers of the current lines 20*d*, 20*f*, 20*h* and 20*j* in the width direction are aligned with the centers in the width direction of the magnetoresistive effect element 10*b*, the magnetoresistive effect element 10*c*, the magnetoresistive effect element 10*d* and the magnetoresistive effect element 10*e*, respectively.

1-2. Simulation Results

The result of simulation performed for clarifying the effects of the present invention will be described below.

[Influence of Number of Current Lines]

FIG. 6 show diagrams of models used to examine the influences of the number of current lines. The model shown in FIG. 6A includes one current line 20 and one magnetoresistive effect element 10 disposed thereunder via the insulating layer 12 (not shown). The model shown in FIG. 6B has an arrangement in addition to the structure of the model shown in FIG. 6A, specifically, the structure obtained by arranging other respective current lines 20 with no magnetoresistive effect element 10 disposed thereunder one by one on both sides of the current line 20 with the magnetoresistive effect element 10 disposed thereunder. The model shown in FIG. 6C has an arrangement in addition to the structure of the model shown in FIG. 6A, specifically, the structure obtained by arranging two other respective current lines 20 with no magnetoresistive effect element disposed thereunder on each of both sides the current line 20 with the magnetoresistive effect element 10 disposed thereunder.

Figure 6A:
FIGS. 6A to 6C are diagrams showing models used to examine the influences of the number of current lines.
Figure 6B:
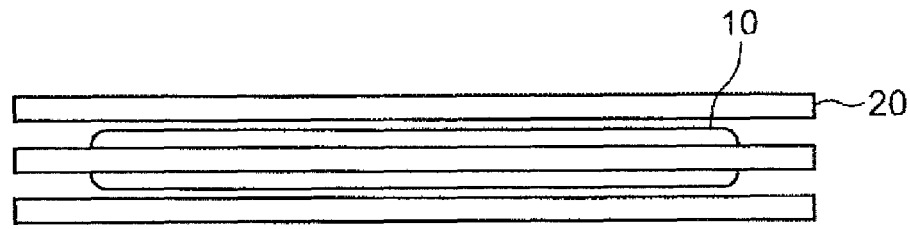
Figure 6C:
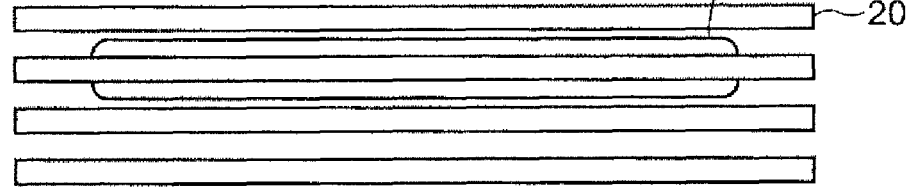
Figure 6C:
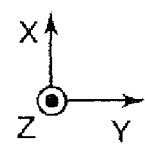

That is, the model of FIG. 6A has one current line 20 in total; the model of FIG. 6B, three current lines 20 in total; and the model of FIG. 6C, five current lines 20 in total.

Simulation was performed by allowing a current of 10 mA to flow through the respective current lines 20, each of which was a conductor made of copper with a rectangular section and having a width (length in the X direction) of 4 μm and a thickness (length in the Z direction) of 0.8 μm. The distance (clearance) between the adjacent current lines 20 was set to 4 μm.

The insulating layer 12 was formed in a thickness of 1 μm.

The magnetoresistive effect element 10 was supposed to be an SVGMR element. In general, the SVGMR element includes a fixed layer made of one or more layers, for example, including a CoFe layer etc., and having a fixed spin direction, and a free layer made of, for example, a NiFe layer etc., and having a spin direction that can easily change depending on the external magnetic field. For simplicity, the simulation was performed by using the magnetoresistive effect element 10 as a monolayer film of NiFe having a saturated magnetic flux density Bs of 1.4 T, a length of 100 μm, a width of 10 μm and a thickness of 20 nm.

Using these models and parameters, the simulation was carried out by using a magnetic field analysis software J-MAG (trademark) manufactured by JSOL Corporation.

Figure 7:
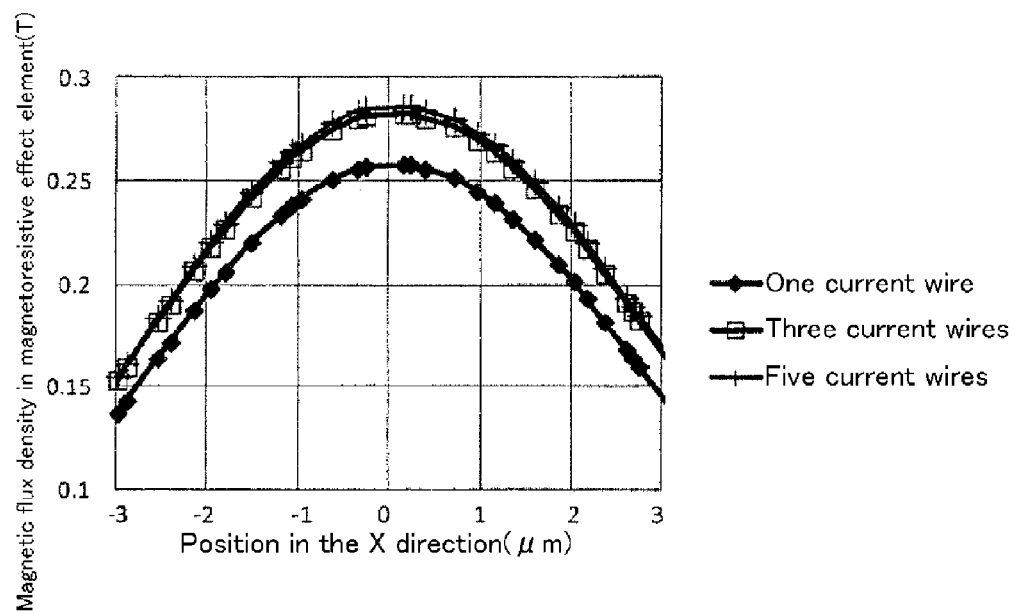
FIG. 7 is a graph showing a simulation result.

FIG. 7 is a graph showing a simulation result.

Note that the term "position in the X direction" on the horizontal axis of the graph in FIG. 7 indicates the position in the width direction of the magnetoresistive effect element 10. The value of 0 μm on the horizontal axis means the center in the width direction of the magnetoresistive effect element 10. A distance in the X direction from the center in the width direction is expressed by a positive value, while a distance in the −X direction from the center is expressed by a negative value.

As can be seen from FIG. 7, the magnetic flux density in the magnetoresistive effect element 10 increases significantly when using three current lines 20, compared to one. In use of three and five current lines 20, the magnetic flux density in the magnetoresistive effect element 10 in the five current lines 20 is larger when using five current lines rather than three, which makes only a small difference.

[Influence of Number of Magnetoresistive Effect Elements]

Figure 8A:
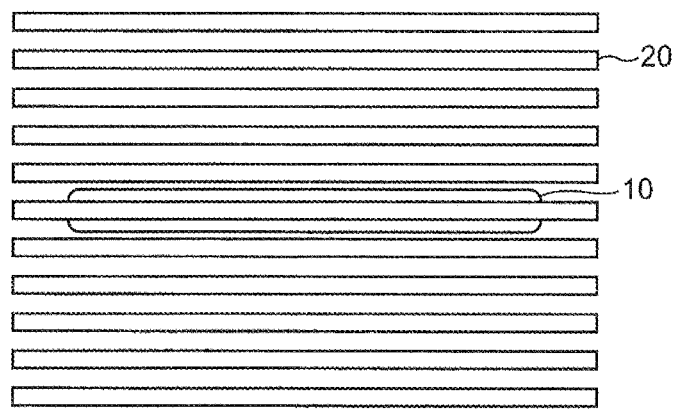
FIGS. 8A to 8C are diagrams showing models used to examine the influences of the number of magnetoresistive effect elements.
Figure 8B:
Figure 8C:
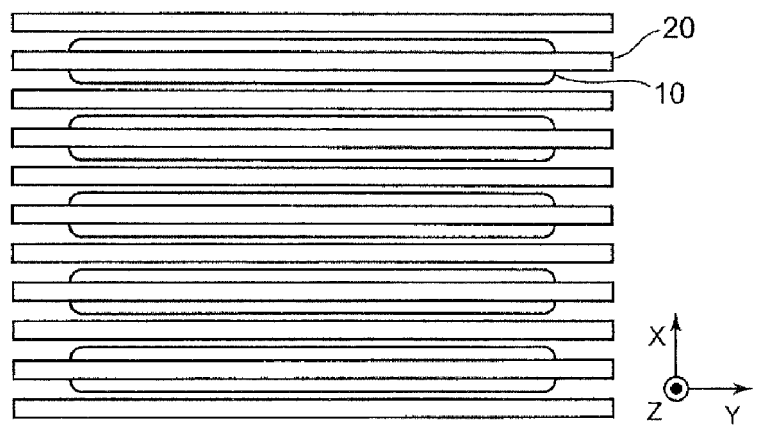

FIG. 8 are diagrams showing models used to examine the influence of the number of magnetoresistive effect elements. Any of these models also includes eleven current lines 20, like FIG. 3. In the model shown in FIG. 8A, only one magnetoresistive effect element 10 is disposed under the center current line 20 (the sixth line from the uppermost side in the drawing) via an insulating layer 12 (not shown). In the model shown in FIG. 8B, three magnetoresistive effect elements 10 in total are disposed under the fourth, sixth and eighth current lines 20 from the uppermost side in the drawing, via the insulating layer 12. The model shown in FIG. 8C has the same structure as that of the magnetic sensor 100 shown in FIG. 3, in which five magnetoresistive effect elements 10 in total are disposed.

These models were used to perform the simulation under the same conditions as those of the above-mentioned examination of "the influence of the number of current lines".

Figure 9:
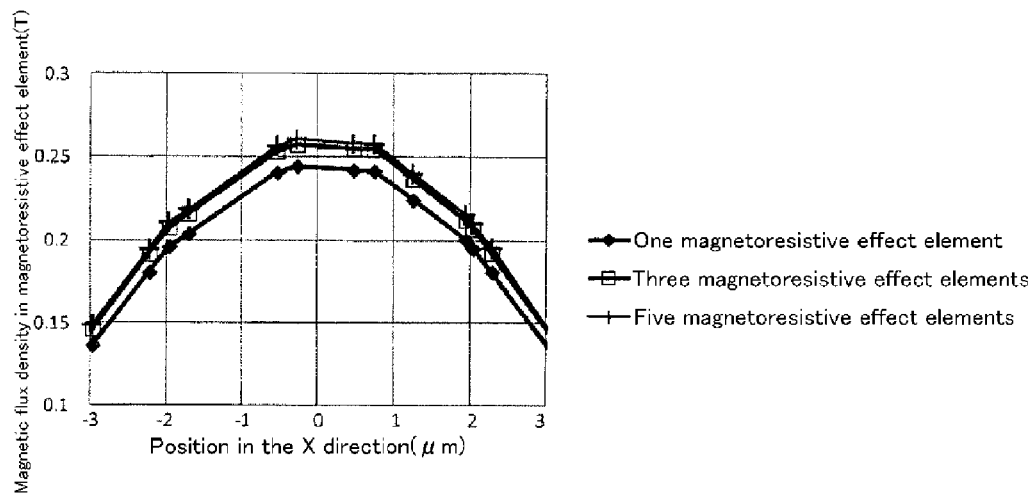
FIG. 9 is a graph showing another simulation result.

FIG. 9 is the simulation result. Note that the term "position in the X direction" on the horizontal axis of the graph in FIG. 9 indicates the position in the width direction within the magnetoresistive effect element 10 positioned at the center in the width direction of each model (in FIG. 8A, the only magnetoresistive effect element 10 shown; in FIG. 8B, the second magnetoresistive effect element 10 counted from the upper side of the paper among three magnetoresistive effect elements 10 shown; and in FIG. 8C, the third magnetoresistive effect element 10 counted from the upper side of the paper among five magnetoresistive effect elements 10 shown). The value of 0 μm on the horizontal axis means the center in the width direction of the magnetoresistive effect element 10. A distance in the X direction from the center in the width direction is expressed by a positive value, while a distance in the −X direction from the center is expressed by a negative value.

As can be seen from FIG. 9, a plurality of magnetoresistive effect elements 10 are disposed to drastically increase the magnetic flux density in the magnetoresistive effect element 10. On the other hand, in use of three and five magnetoresistive effect elements 10, the magnetic flux density in the magnetoresistive effect element 10 does not change so much.

Now, the simulation results regarding the relationship between $L_s/W_g$ and the magnetic field (magnetic flux density) applied to the magnetoresistive effect element will be shown.

[Relationship between $L_s/W_g$ and magnetic field (magnetic flux density) applied to magnetoresistive effect element]

The simulation was carried out by using the structure, that is a portion of the structure shown in FIG. 3B, included a current line (first current line) 20a, a current line (second current line) 20b, a current line (third current line) 20c, and a magnetoresistive effect element 10a disposed under the current line 20b via an insulating layer 12a.

Each of the current lines 20a, 20b and 20c had the width $W_p$, and a distance (clearance) between the adjacent current lines was set to $d_2$. Thus, the length $L_s$ was $(3W_p+2d_2)$, which is the total of the widths of the current lines 20a to 20c ($3 \times W_p$ in total), the distance $d_2$ between the current line 20a and the current line 20b, and the distance $d_2$ between the current line 20b and the current line 20c.

The magnetoresistive effect element 10a had the width $W_g$.

The magnetic flux densities within the magnetoresistive effect element 10a to be obtained when changing a ratio of the length $L_s$ to the width $W_g$, namely, $L_s/W_g$ were determined by the simulation. The $L_s/W_g$ was varied by changing $W_p$ from 2 μm to 10 μm, $W_g$ from 5 μm to 20 μm, and $d_2$ from 2 μm to 10 μm. Other conditions for this simulation were set to the same as those of the above-mentioned simulation regarding [influence of number of current lines].

Figure 10:
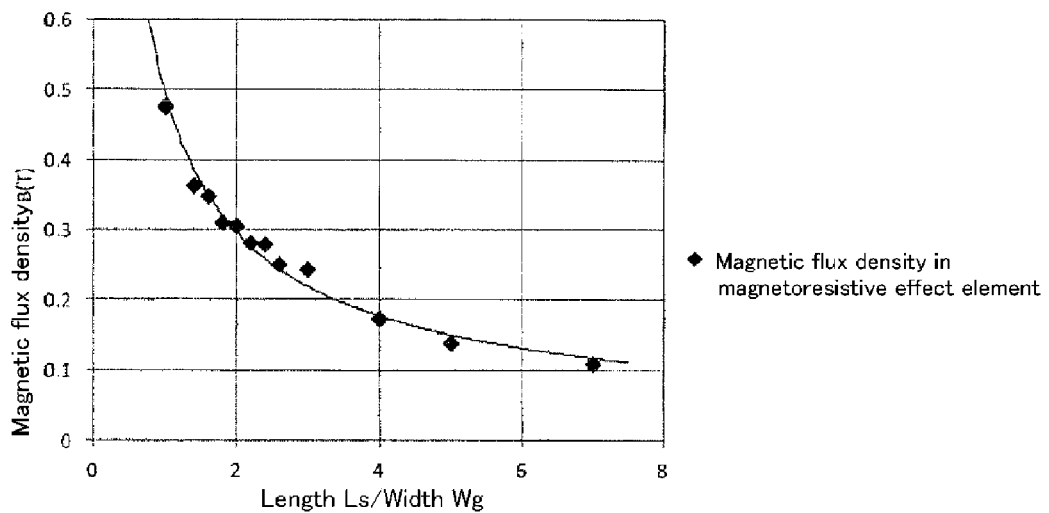
FIG. 10 is a graph showing another simulation result.

FIG. 10 shows the simulation result. The respective points in the graph were calculated values, and the curved line was an approximate power curve determined by these points (calculated values) on the graph.

As can be seen from FIG. 10, if $L_s/W_g$ is equal to or less than 5, the magnetic flux density in the magnetoresistive effect element can be a sufficiently high value of 0.15 (T) or more. In particular, if the $L_s/W_g$ is equal to or less than 3, the magnetic flux density in the magnetoresistive effect element becomes an excessively high value of 0.26 (T) or more, creating a significant feedback magnetic field.

FIG. 11 are graphs illustrating simulation results different from those shown in FIG. 10.

As can be seen from FIG. 10, if $L_s/W_g$ is equal to or less than 5, the magnetic flux density in the magnetoresistive effect element caused by the feedback current is 0.15 (T) or more. FIG. 10 shows the result obtained by setting the feedback current to 10 mA. If the magnetic flux density in the magnetoresistive effect element determined by applying the external magnetic field to be measured (for example, external magnetic field induced by the current to be measured) is 0.15 (T), the magnetic field can be canceled by the feedback current of 10 mA, which can lead to the magnetic equilibrium state.

Figure 11A:
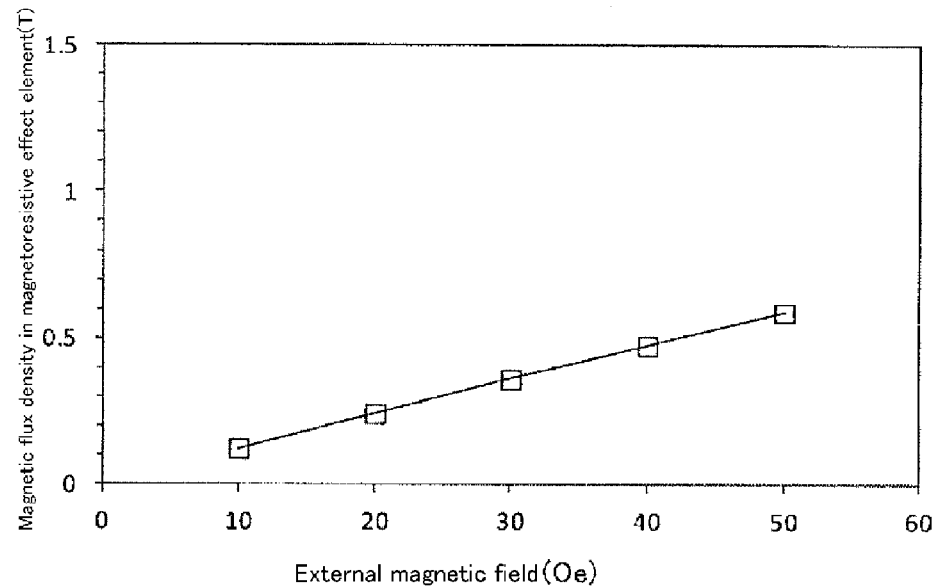
FIGS. 11A and 11B are graphs showing simulation results other than FIG. 10.

FIG. 11A shows the magnetic flux density in the magnetoresistive effect element 10 when the external magnetic field parallel to the width direction is applied to the magnetoresistive effect element 10 with a width $W_g$ of 5 μm. It shows that the magnetic flux density was approximately 0.6 T at the external magnetic field of 50 Oe, while the magnetic flux density was approximately 0.2 T at the magnetic field to be measured of the 20 Oe. FIG. 10 shows the result obtained by setting the feedback current to 10 mA. It can be found that the feedback current of approximately 13 mA can cancel the magnetic field to be measured of 20 Oe. Even if a disturbance magnetic field of 50 Oe is applied, the instant application of the reset current of 39 mA can magnetically bring the magnetoresistive effect element 10 into an initial state. Any one of these consumed currents is obviously lower than that in the conventional magnetic sensor. In one conventional magnetic balance current sensor, as mentioned above, the current line to be measured generates the induced magnetic field in a C-shaped core, and the feedback current is allowed to flow through the wiring to cancel the induced magnetic field. The current value or voltage value proportional to the current value is measured to determine the current to be measured. The consumption current value required for the feedback is a value obtained by dividing the number of turns N1 of the current line to be measured by the number of turns N2 of the feedback wiring, and then multiplying it by a current value I to be measured, namely, I×(N1/N2). Since the sensor itself is required to be compact (for example, to be mounted on vehicles), the increase in the number N2 is restricted due to limitations on allowable current values of the current lines and the like, resulting in an increase in consumption current.

Here, as an example of $L_s/W_g=5$, the condition of $W_p=W_g=d_2$, e.g., $W_p=5$ μm, $W_g=5$ μm, and $d_2=5$ μm, can be applied.

Figure 11B:
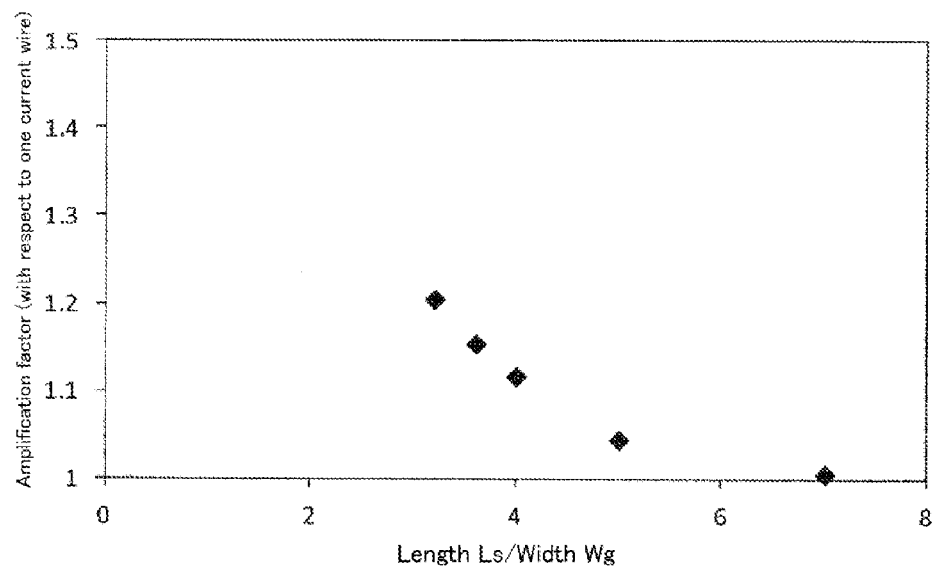

FIG. 11B is a graph showing the relationship between an amplification ratio and $L_s/W_g$, in which the amplification ratio is a ratio of the magnetic flux density in the magnetoresistive effect element with three current lines to the magnetic flux density in the magnetoresistive effect element with one current line. The length $W_g$ in the width direction of the magnetoresistive effect element was set to 5 μm. FIG. 11B shows that if $L_s/W_g$ is 5 or less, the significant feedback magnetic field can be applied to the magnetoresistive effect element. That is, when $W_g$ is 5 μm, $L_s$ should be preferably equal to or less than 25 μm.

Note that in the present invention, it is preferred that the thickness of the current line 20 is in a range of 0.4 μm to 5 μm, the width $W_p$ thereof is in a range of 2 μm to 10 μm, and a distance (clearance) between the adjacent current lines 20 is in a range of 2 μm to 10 μm. The current line 20 is formed of material having excellent electric conductivity, such as copper, silver or aluminum.

The width $W_g$ of the magnetoresistive effect element 10 is preferably in a range of 4 μm to 20 μm. The length of the magnetoresistive effect element 10 (length in the direction along the current line 20) is preferably 500 μm or more from a viewpoint of dielectric strength voltage.

Other embodiments of the present invention will be described below. In these embodiments, unless otherwise specified, the structures of other components may be the same as those in the first embodiment. Elements with the same reference characters may have the same structure even in different embodiments, unless otherwise specified.

To make comparison with explanatory diagrams for these embodiments easy, before description of the respective embodiments, a magnetic sensor 120 will be described below.

Figure 12A:
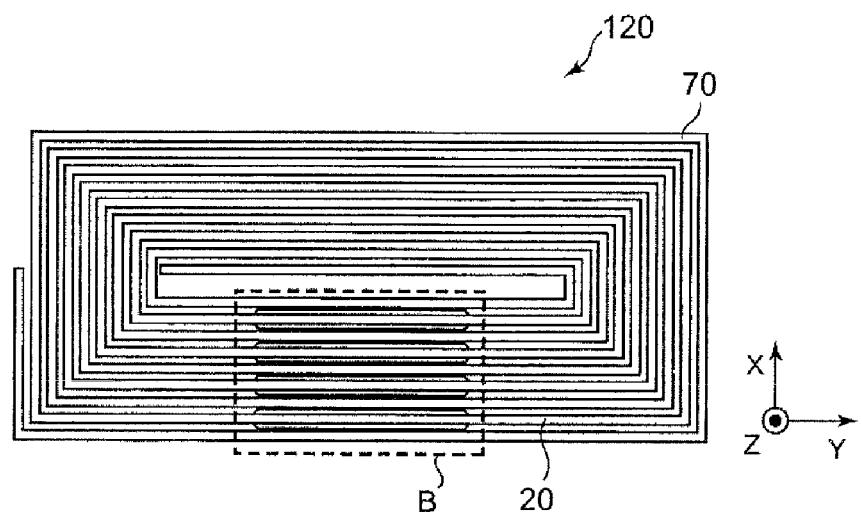
Figure 12B:
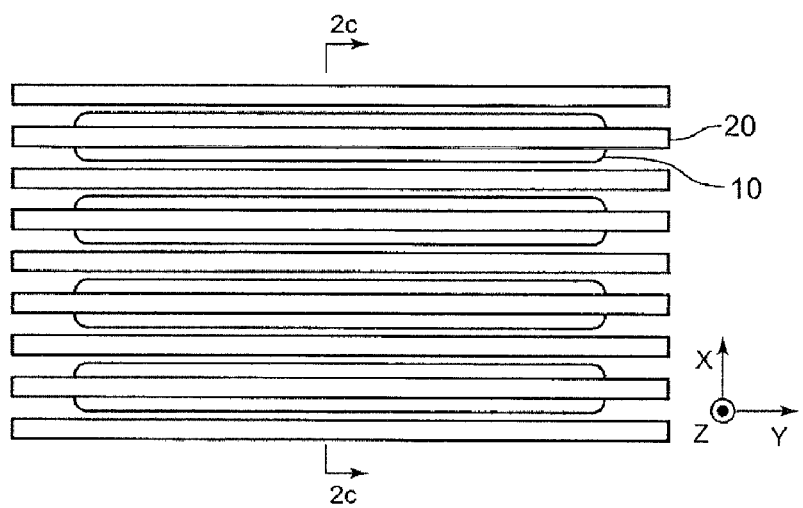
Figure 12C:
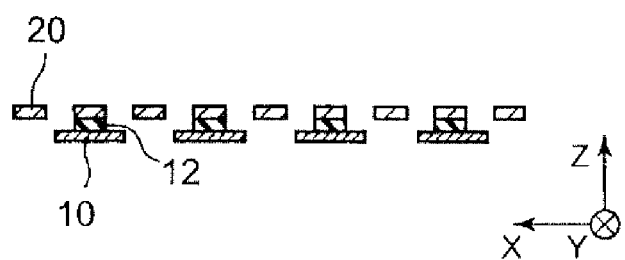

FIG. 12 shows the magnetic sensor 120 according to modification of the first embodiment, in which FIG. 12A is a top view of the magnetic sensor 120, FIG. 12B is an enlarged top view of a linear portion B of the planar coil 70 shown in FIG. 12A, and FIG. 12C is a cross-sectional view taken along the line 2c-2c of FIG. 12B.

The magnetic sensor 120 differs from the magnetic sensor 100 in that the number of current lines 20 disposed in the linear portion of the coil 70 is nine, and that the number of magnetoresistive effect elements 10 is four. The structures of other components of the magnetic sensor 120 are substantially the same as those of the magnetic sensor 100.

2. Second Embodiment

Figure 13A:
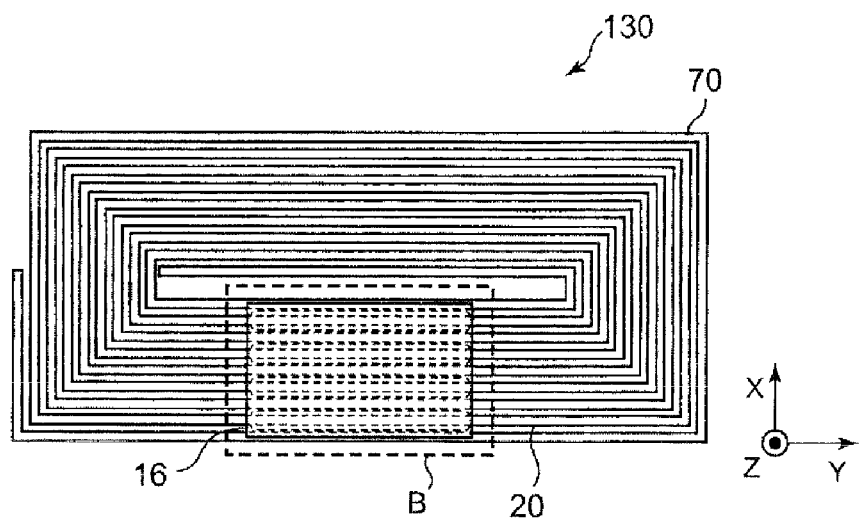
Figure 13B:
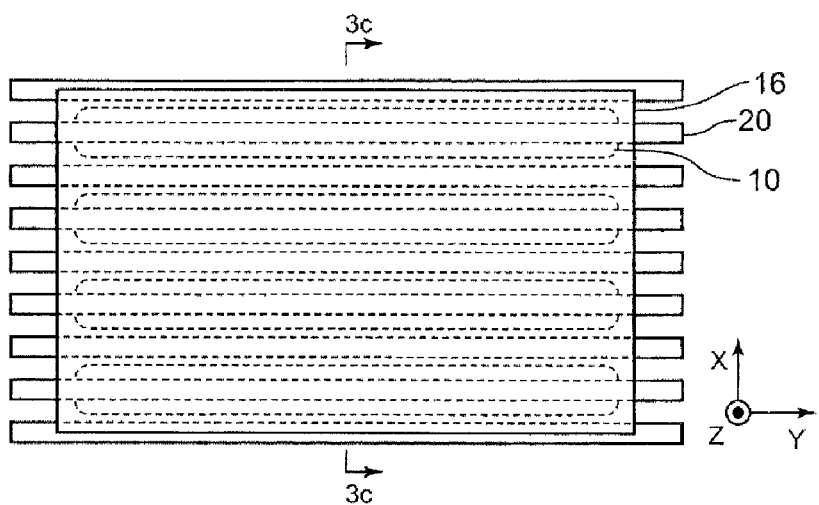
Figure 13C:
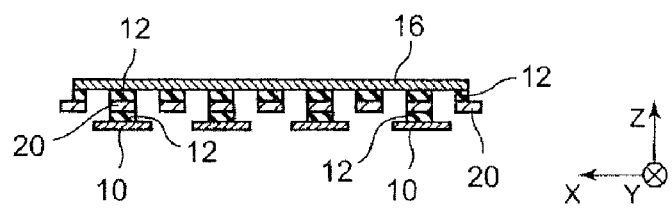

FIG. 13 shows a magnetic sensor 130 according to a second embodiment of the present invention, in which FIG. 13A is a top view of the magnetic sensor 130, FIG. 13B is an enlarged top view of a linear portion B of the planar coil 70 shown in FIG. 13A, and FIG. 13C is a cross-sectional view taken along the line 3c-3c of FIG. 13B.

The magnetic sensor 130 in the second embodiment differs from the magnetic sensor 120 in the first embodiment in that a yoke layer 16 is disposed over the current lines 20.

The yoke layer 16 is disposed over the current lines 20 so as to cover at least one group of a combination of three current lines (that is, the first to third current lines), including one current line 20 with the magnetoresistive effect element 10 disposed thereunder, and two current lines disposed adjacent to both sides of the current line 20. The yoke layer 16 is provided over (or above) the current lines 20 so as to cover, preferably, two groups or more of current lines 20, and more preferably, as shown in FIG. 13, all groups of current lines 20 (note that in FIG. 13, four current lines have the magnetoresistive effect elements 10 disposed thereunder, and each of these current lines 20 has other current lines 20 adjacent to its both sides, whereby the five current lines in total are adjacent to the respective four current lines. In this way, the nine current lines 20 in total are shown in the drawing).

Note that in the embodiment shown in FIGS. 13B and C, two current lines 20 positioned on the outermost side (in FIG. 13B, the uppermost current line 20 and the lowermost current line 20) are partly covered by the yoke layer 16 in the width direction (X direction). In this way, the current line 20 without having any magnetoresistive effect element thereunder may be covered only partly in the width direction.

To ensure insulation between the yoke layer 16 and the current lines 20, as shown in FIG. 13C, the insulating layer 12 may be formed between the yoke layer 16 and the current line 20.

Note that the yoke layer, such as the yoke layer 16, may be formed of any existing soft magnetic material. Preferable soft magnetic materials can include, for example, permalloy (Ni—Fe alloy). The yoke layer can be formed, for example, by sputtering or plating the soft magnetic material.

In this way, the yoke layer 16 is disposed over the current lines 20, whereby a magnetic field that passes through above the current lines 20, in the feedback magnetic field formed around the current lines 20 (that is, a magnetic field passing through a side opposite to the side with the magnetoresistive effect element 10 via the current line 20 sandwiched therebetween) is permitted to pass through the yoke layer 16. Such a structure increases the magnetic flux density in this part, which effectively forms a magnetic circuit together with the magnetoresistive effect elements 10 disposed under the current lines 20. Accordingly, it is considered that more feedback magnetic field is applied to the magnetoresistive effect elements 10, even when the same magnitude of current is allowed to pass through the current lines 20.

The yoke layer 16 preferably has a thickness of 0.2 μm or more. As shown in FIG. 13, the yoke layer preferably has a length (length in the Y direction) that can cover the magnetoresistive effect elements 10 in the length direction when shown in the planar view.

As shown in FIG. 13C, when the yoke layer is conductive with the insulating layer 12 formed between the current line 20 and the yoke layer 16, the thickness of the insulating layer 12 is preferably 1 μm or more.

[Simulation Results]

Next, the results of simulation performed for clarifying the effects of the present invention will be described.

The simulation was carried out using the magnetic sensor 120 with the structure as shown in FIG. 12 and the magnetic sensor 130 with the structure as shown in FIG. 13, as the models.

In the simulation, each current line 20 was a conductor made of copper with a rectangular section and having a width (length in the X direction) of 4 μm and a thickness (length in the Z direction) of 1 μm. The distance (clearance) between the adjacent current lines 20 was set to 4 μm.

The insulating layer 12 disposed between the current line 20 and the magnetoresistive effect element 10 had a length (length in the Y direction) of 100 μm, a width of 4 μm and a thickness of 1 μm.

The magnetoresistive effect element 10 was supposed to be an SVGMR element. In general, the SVGMR element includes a fixed layer made of one or more layers, for example, a CoFe layer etc., and having a fixed spin direction, and a free layer made of, for example, a NiFe layer etc., and having a spin direction that can easily change depending on the external magnetic field. For simplicity, the magnetoresistive effect element 10 was made of a monolayer film made of NiFe and having a saturated magnetic flux density Bs of 1.4 T, the total amount of magnetization of 2δ, a length of 100 μm, a width of 10 μm and a thickness of 20 nm.

The magnetic sensor 130 has the yoke layer 16 disposed as illustrated in FIG. 13 and having a length (in the Y direction) of 100 μm, a width (in the X direction) of 10 μm, and a thickness of 0.2 μm.

The insulating layer 12 disposed between the current line 20 and the yoke layer 16 had a length of 100 μm, a width of 4 μm and a thickness of 1 μm.

Using these models and parameters, the simulation was carried out by using the above-mentioned magnetic field analysis software J-MAG (trademark).

Figure 14:
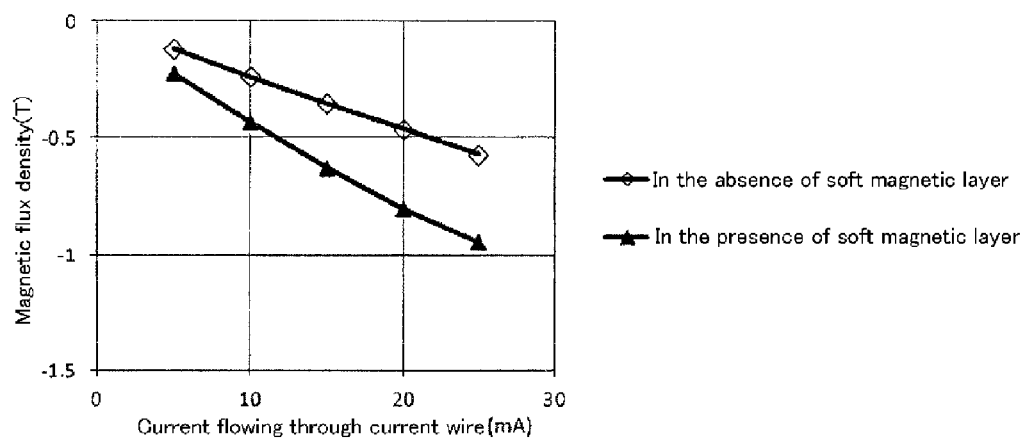
FIG. 14 is a graph showing another simulation result.

FIG. 14 is a graph showing the simulation result.

In FIG. 14, the horizontal axis of the graph indicates the magnitude of current (feedback current) flowing through the current lines, and the vertical axis indicates the magnitude of a magnetic field (magnetic flux density) applied to the magnetoresistive effect element 10. FIG. 14 represents the magnitude of a magnetic field by a negative value, but indicates that as the absolute value of the magnitude of a magnetic field is increased, the applied magnetic field becomes larger.

As can be seen from the result in FIG. 14, at the same current, the magnetic sensor 130 with the yoke layer 16 can apply the large feedback magnetic field to the magnetoresistive effect element 10, as compared to the magnetic sensor 120 without having any soft magnetic material 16.

3. Third Embodiment

Figure 15A:
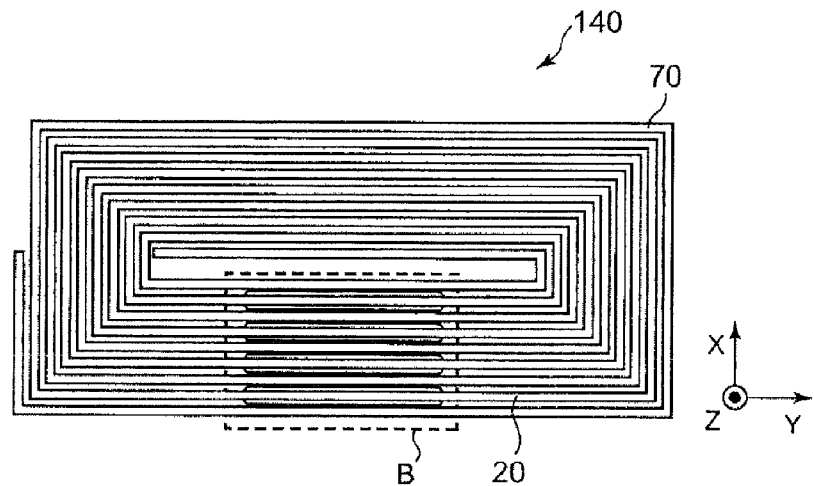
Figure 15B:
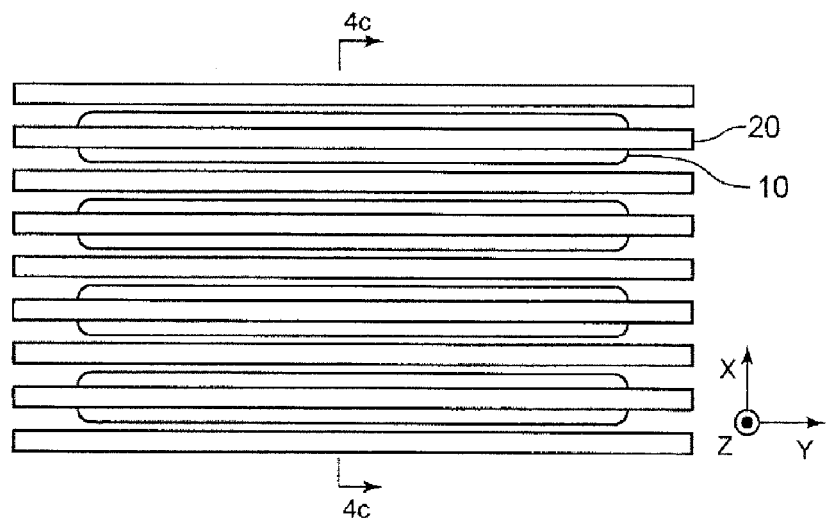
Figure 15C:
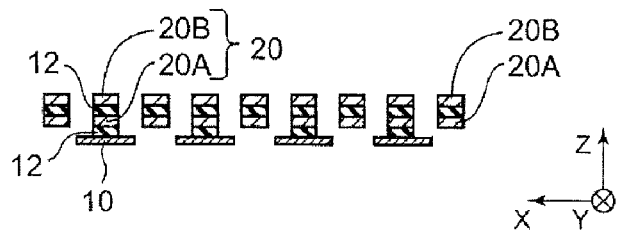

FIG. 15 shows a magnetic sensor 140 according to a third embodiment of the present invention, in which FIG. 15A is a top view of the magnetic sensor 140, FIG. 15B is an enlarged top view of a linear portion B of the planar coil 70 shown in FIG. 15A, and FIG. 15C is a cross-sectional view taken along the line 4c-4c of FIG. 15B.

The magnetic sensor 140 differs from the magnetic sensor 120 of the first embodiment in that as shown in FIG. 15C, the coil 70 has a double-layered structure which includes two layers, namely, a first current line 20A and a second current line 20B disposed over the first current line via the insulating layer 12 in the height direction (in the Z direction).

That is, in this embodiment, the current lines 20 are comprised of the first current line 20A and the second current line 20B which are stacked over each other via the insulating layer 12.

In the magnetic sensor 140, the first current line 20A and the magnetoresistive effect element 10 have the same structures of the magnetic sensor 120. The second current lines 20B are disposed over the respective first current lines 20A via the insulating layers 12.

In this way, the current lines are designed to have the double-layered structure, so that the feedback magnetic fields formed by both the current lines 20A and the current lines 20B are applied to the magnetoresistive effect elements 10. Accordingly, the larger feedback magnetic field can be applied to the magnetoresistive effect elements 10 at the same current value as before.

The first current line 20A and the second current line 20B may have the same size, the same material and the like as those of the current line 20.

In the preferred embodiment, as shown in FIG. 15A, the first layer of the coil 70 formed of the first current line 20A is aligned with the second layer of the coil 70B formed of the second current line 20B in the top view. Preferably, the first layer of the coil 70, the second layer of the coil 70, and the like are connected in series. The same magnitude of current is allowed through the first current line 20A and the second current line 20B.

Alternatively, the number of layers of the current lines through which the feedback current flows may be three layers or more (three layers or more in the height direction).

[Simulation Results]

Next, the results of simulation performed for clarifying the effects of the present invention will be described.

The simulation was carried out using the magnetic sensor 140 with the structure as shown in FIG. 15 as the model.

In the simulation, the first current line 20A was a conductor made of copper with a rectangular section and having a width (length in the X direction) of 4 μm and a thickness (length in the Z direction) of 1 μm. The distance (clearance) between the adjacent current lines 20A was set to 4 μm.

The insulating layer 12 disposed between the first current line 20A and the magnetoresistive effect element 10 had a length (length in the Y direction) of 100 μm, a width of 4 μm and a thickness of 1 μm.

The second current line 20B was also a conductor made of copper with a rectangular section and having a width of 4 μm and a thickness of 1 μm. The distance (clearance) between the adjacent current lines 20B was set to 4 μm.

The insulating layer 12 disposed between the first current line 20A and the second current line 20B had a length of 100 μm, a width of 4 μm, and a thickness of 1 μm.

Conditions other than the above-mentioned ones were set to the same as the simulation conditions for the magnetic sensor 120 in the second embodiment.

Figure 16:
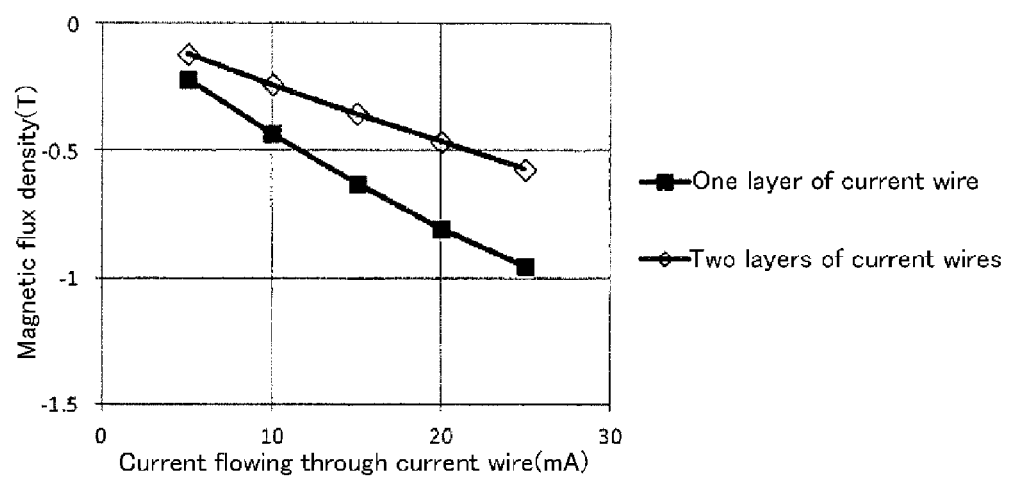
FIG. 16 is a graph showing another simulation result.

FIG. 16 is a graph showing a simulation result.

In FIG. 16, the horizontal axis of the graph indicates the magnitude of current (feedback current) flowing through the first current line 20A and the second current line 20B, and the vertical axis indicates the magnitude of a magnetic field (magnetic flux density) applied to the magnetoresistive effect element 10.

FIG. 16 also shows the simulation result of the magnetic sensor 120 in the second embodiment again.

Although in FIG. 16, the magnitude of a magnetic field is represented by a negative value, it shows that as the absolute value of the magnitude of a magnetic field is increased, the applied magnetic field becomes larger.

As can be seen from the result in FIG. 16, at the same current, the magnetic sensor 140 with the current lines having the double-layered structure can apply the larger feedback magnetic field to the magnetoresistive effect element 10, than the magnetic sensor 120 with the current line having a single layer structure.

4. Fourth Embodiment

Figure 17A:
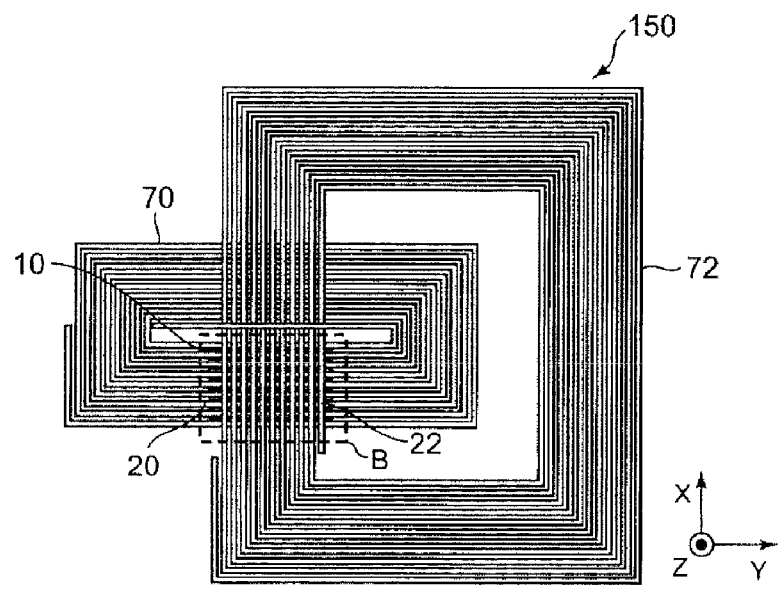
Figure 17B:
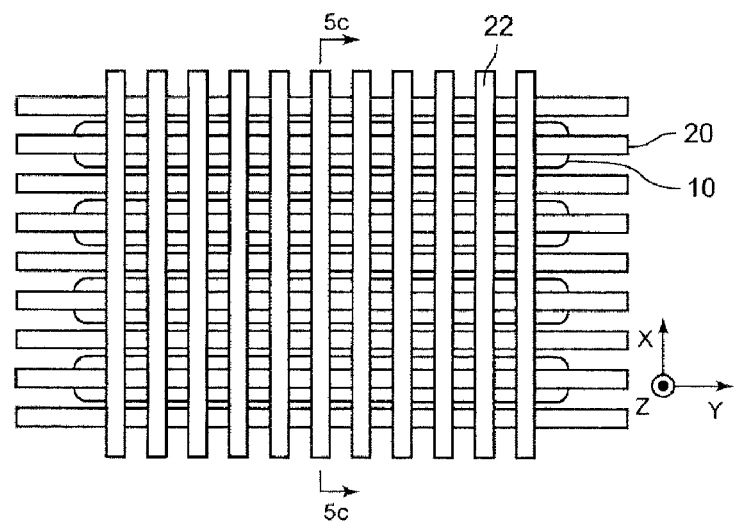
Figure 17C:
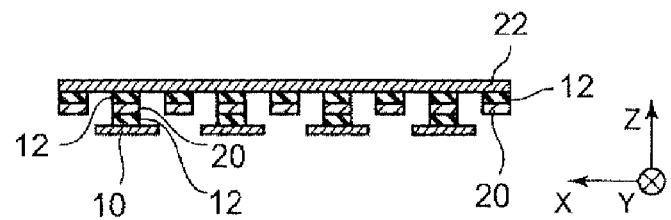

FIG. 17 shows a magnetic sensor 150 according to a fourth embodiment of the present invention, in which FIG. 17A is a top view of the magnetic sensor 150, FIG. 17B is an enlarged top view of a linear portion B of the planar coil 70 shown in FIG. 17A, and FIG. 17C is a cross-sectional view taken along the line 5c-5c of FIG. 17B.

The magnetic sensor 150 differs from the magnetic sensor 120 of the first embodiment in that bias-magnetic-field applying current lines 22 are disposed over the current line 20 via the insulating layer 12.

In use of, e.g., a SVGMR element as the magnetoresistive effect element 10, the free layer having its spin direction changeable by the external magnetization is preferably subjected to a bias magnetic field to align the magnetic domains in order to achieve the higher measurement accuracy. Thus, in the magnetic sensor of this embodiment, in addition to the current lines 20, the bias-magnetic-field applying current lines 22 are provided for applying the bias magnetic field to the magnetoresistive effect element 10.

The bias-magnetic-field applying current lines 22 extend in the direction vertical to the extending direction (in the Y direction) of the magnetoresistive effect elements 10 (that is, in the direction vertical to the extending direction of the current lines 20).

To enable the application of the bias magnetic field to the entire length of each magnetoresistive effect elements 10, as shown in FIG. 17, a plurality of bias-magnetic-field applying current lines 22 is preferably arranged in parallel to each other along the extending direction of the magnetoresistive effect elements 10. In the embodiment shown in FIG. 17, there are provided 11 bias-magnetic-field applying current lines.

The bias-magnetic-field applying current lines 22 are preferably parts of a planar coil 72. This is because the voltage is applied to both ends of the planar coil 72 to allow the current to flow through the plurality of bias-magnetic-field applying current lines 22.

Note that the size and compositional material of the bias-magnetic-field applying current line 22 may be the same as those of the current line 20.

Figure 18A:
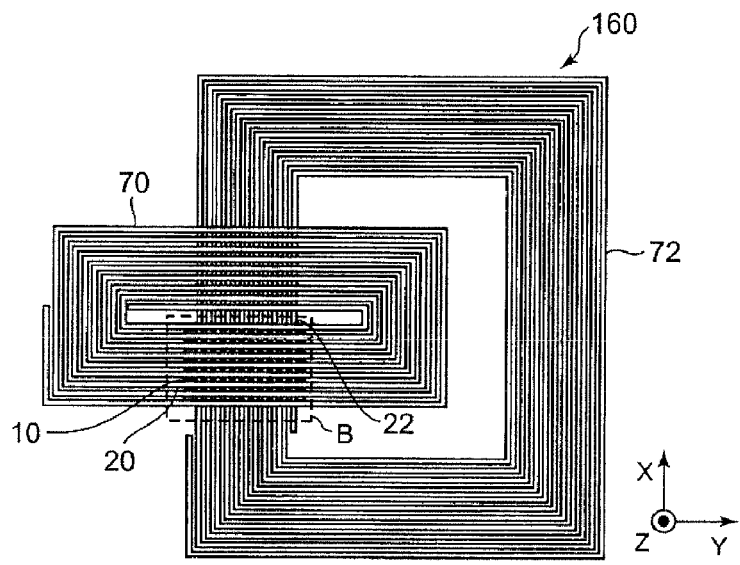
Figure 18B:
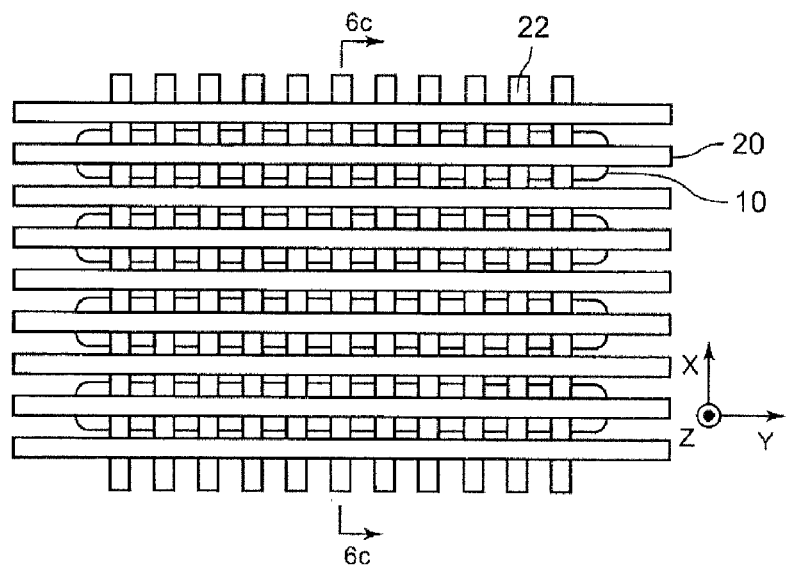
Figure 18C:
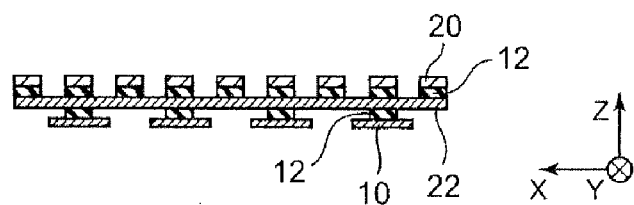
FIG. 18C is a cross-sectional view taken along the line 6c-6c of FIG. 18B.

FIG. 18 shows a magnetic sensor 160 according to modification of the fourth embodiment of the present invention, in which FIG. 18A is a top view of the magnetic sensor 160, FIG. 18B is an enlarged top view of a linear portion B of the planar coil 70 shown in FIG. 18A, and FIG. 18C is a cross-sectional view taken along the line 6c-6c of FIG. 18B.

The magnetic sensor 160 differs from the magnetic sensor 120 of the first embodiment in that the bias-magnetic-field applying current lines 22 are disposed between the magnetoresistive effect elements 10 and the current lines 20 via the insulating layers 12 (note that the insulating layers 12 may be disposed both between the magnetoresistive effect element and the current line 22, and between the current line 20 and the current line 22). The structures of other components in the magnetic sensor 160 may be the same as those in the magnetic sensor 150.

That is, in the magnetic sensor 150, the current line 20 is disposed closer to the magnetoresistive effect element 10 rather than the bias-magnetic-field applying current line 22, while in the magnetic sensor 160 the bias-magnetic-field applying current line 22 is disposed closer to the magnetoresistive effect element 10 rather than the current line 20.

The arrangement of the magnetic sensor 150 is better, when the magnetic field range to be measured is intended to be expanded, that is, when the feedback magnetic field is proposed to be strengthened. On the other hand, the arrangement of the magnetic sensor 160 is better, when the more accurate measurement is required.

5. Fifth Embodiment

Figure 19A:
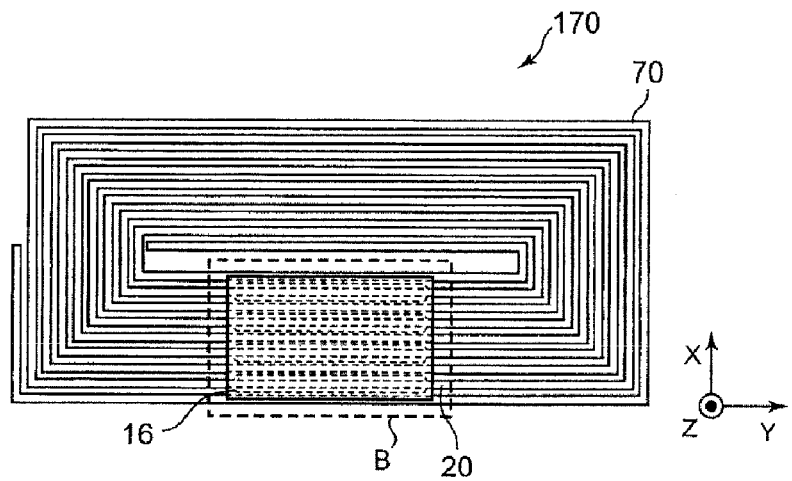
Figure 19B:
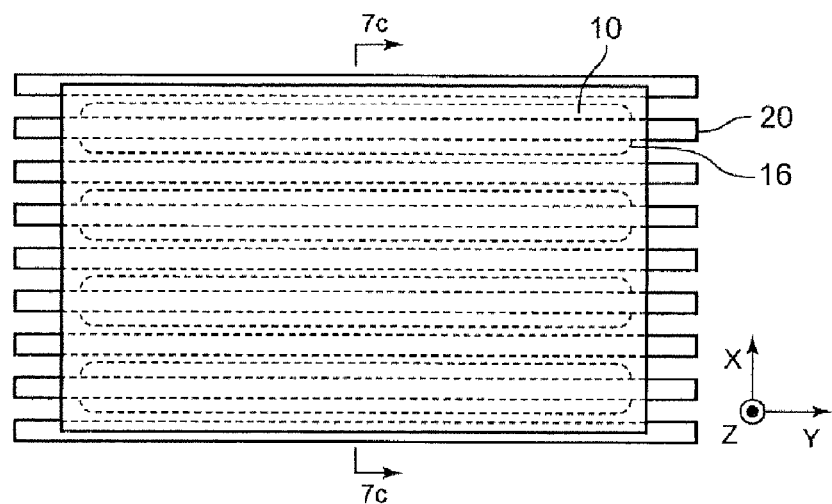
Figure 19C:
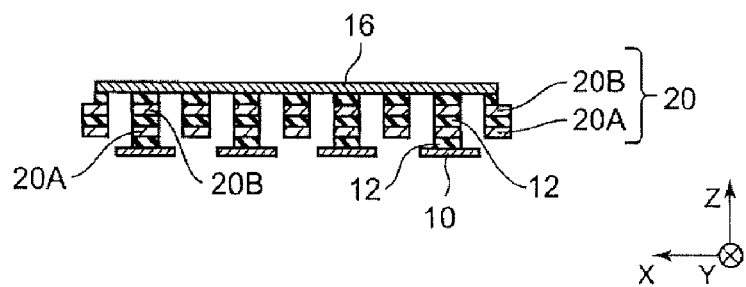

FIG. 19 shows a magnetic sensor 170 according to a fifth embodiment of the present invention, in which FIG. 19A is a top view of the magnetic sensor 170, FIG. 19B is an enlarged top view of a linear portion B of the planar coil 70 shown in FIG. 19A, and FIG. 19C is a cross-sectional view taken along the line 7c-7c of FIG. 19B.

The magnetic sensor 170 has the structure obtained by changing the current lines 20 in the above-mentioned magnetic sensor 130 into a double-layered structure of the first current line 20A and the second current line 20B shown in the above-mentioned magnetic sensor 140.

6. Sixth Embodiment

Figure 20A:
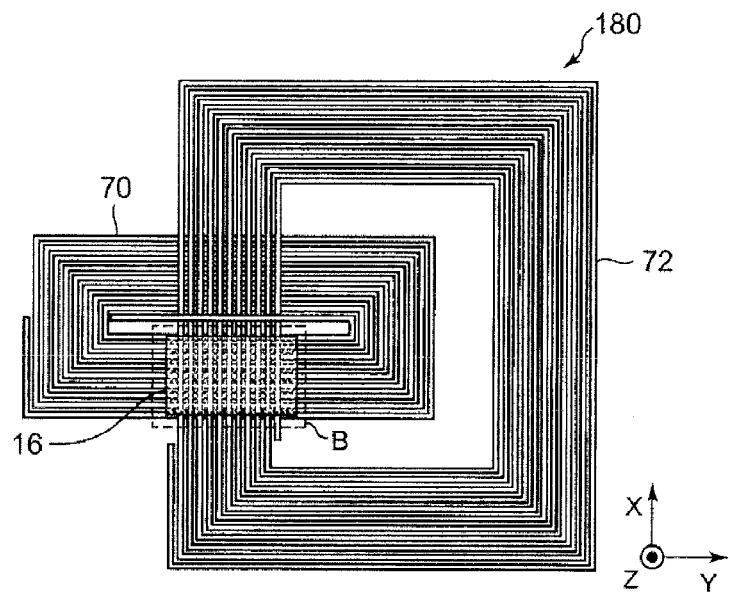
Figure 20B:
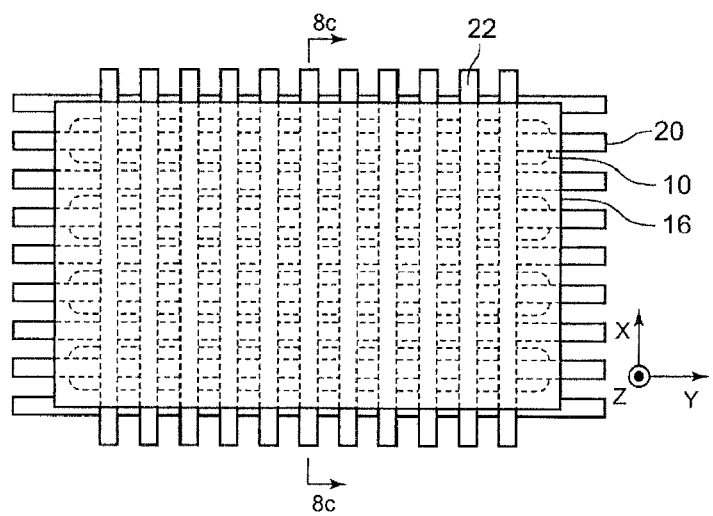
Figure 20C:
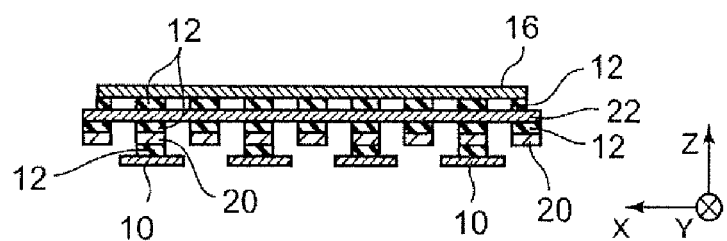

FIG. 20 shows a magnetic sensor 180 according to a sixth embodiment of the present invention, in which FIG. 20A is a top view of the magnetic sensor 180, FIG. 20B is an enlarged top view of a linear portion B of the planar coil 70 shown in FIG. 20A, and FIG. 20C is a cross-sectional view taken along the line 8c-8c of FIG. 20B.

The magnetic sensor 180 has the structure obtained by providing the yoke layer 16 shown in the above-mentioned magnetic sensor 130, over the bias-magnetic-field applying current lines via the insulating layer 12 in the above-mentioned magnetic sensor 150.

Figure 21A:
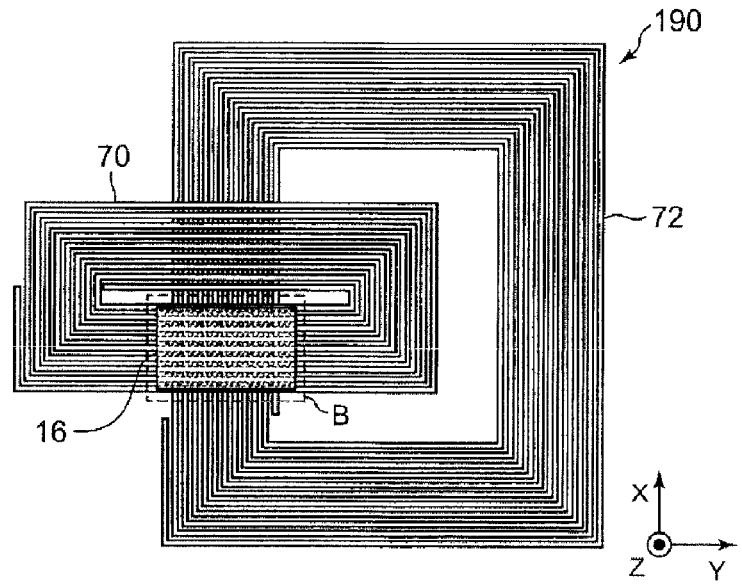
Figure 21B:
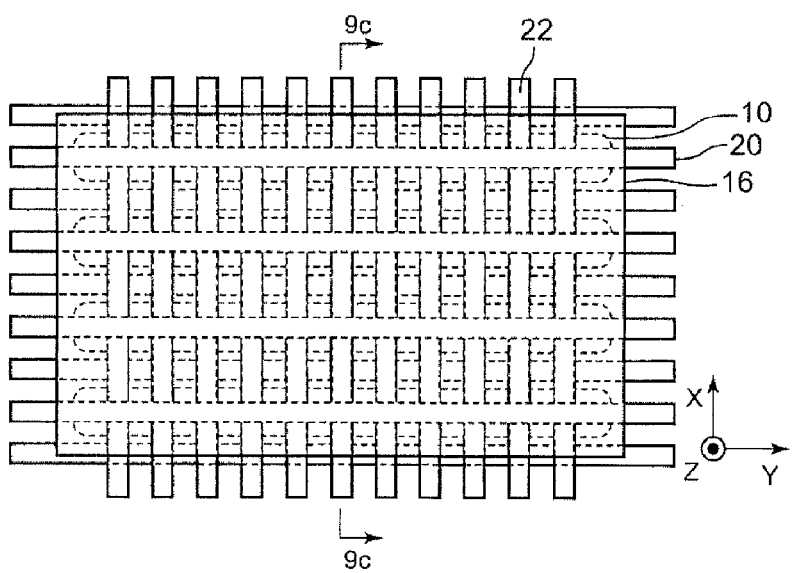
Figure 21C:
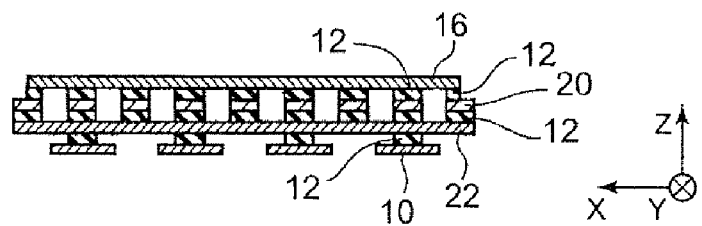

FIG. 21 shows a magnetic sensor 190 according to modification of the sixth embodiment of the present invention, in which FIG. 21A is a top view of the magnetic sensor 190, FIG. 21B is an enlarged top view of a linear portion B of the planar coil 70 shown in FIG. 21A, and FIG. 21C is a cross-sectional view taken along the line 9c-9c of FIG. 21B.

The magnetic sensor 190 has the structure obtained by providing the yoke layer 16 shown in the above-mentioned magnetic sensor 130, over the current lines 20 in the above-mentioned magnetic sensor 160 via the insulating layers 12.

7. Seventh Embodiment

Figure 22A:
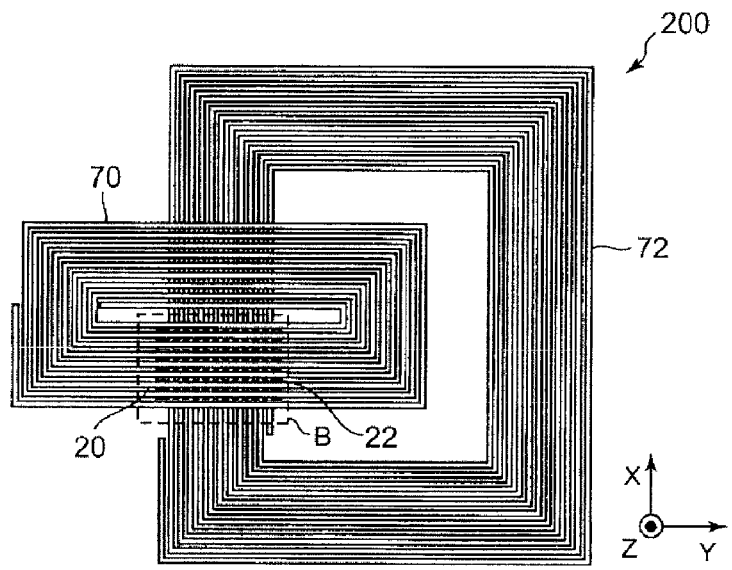
Figure 22B:
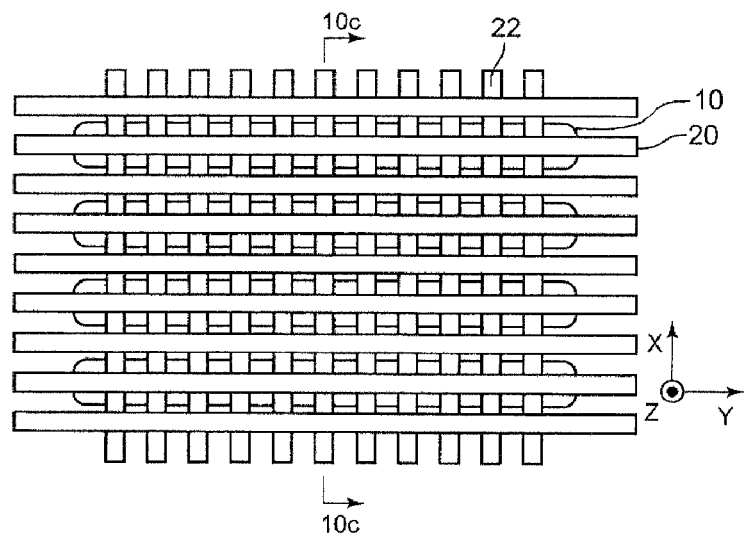
Figure 22C:
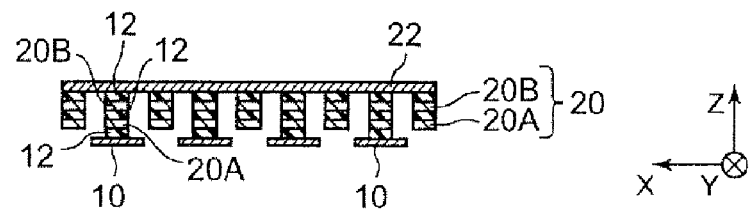

FIG. 22 show a magnetic sensor 200 according to a seventh embodiment of the present invention, in which FIG. 22A is a top view of the magnetic sensor 200, FIG. 22B is an enlarged top view of a linear portion B of the planar coil 70 shown in FIG. 22A, and FIG. 22C is a cross-sectional view taken along the line 10c-10c of FIG. 22B.

The magnetic sensor 200 has the structure obtained by providing the bias-magnetic-field applying current lines 22 shown in the above-mentioned magnetic sensor 150, over the second current lines 20B in the above-mentioned magnetic sensor 140 via the insulating layers 12.

Figure 23A:
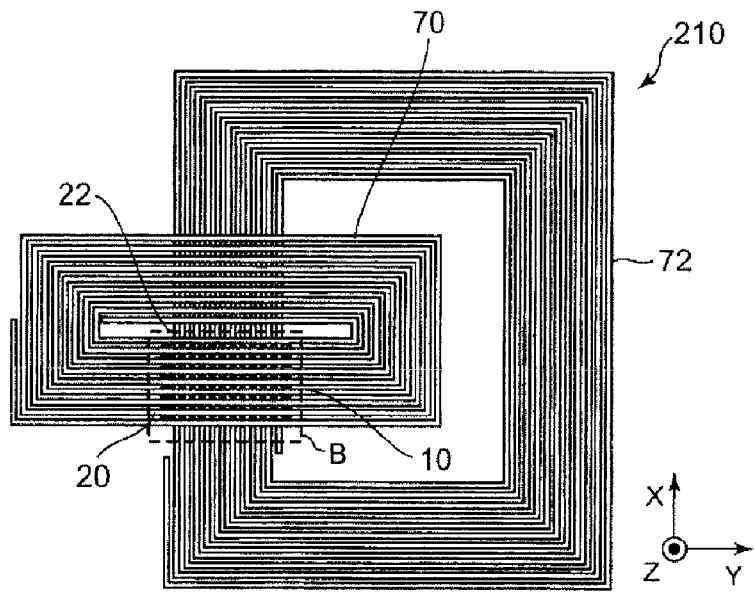
Figure 23B:
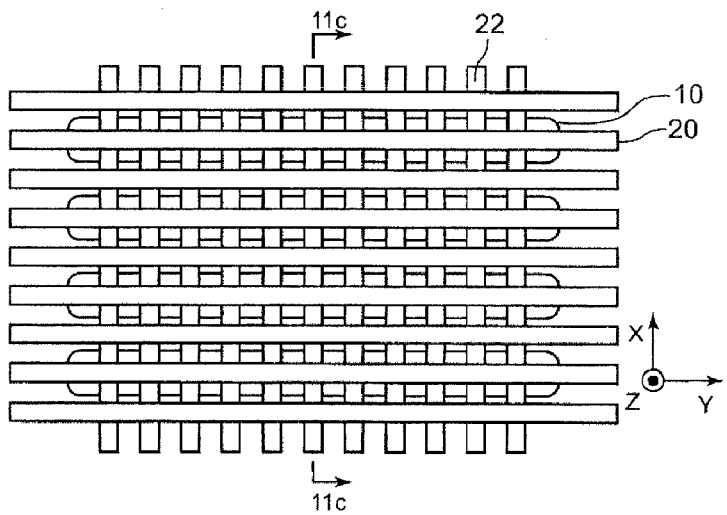
Figure 23C:
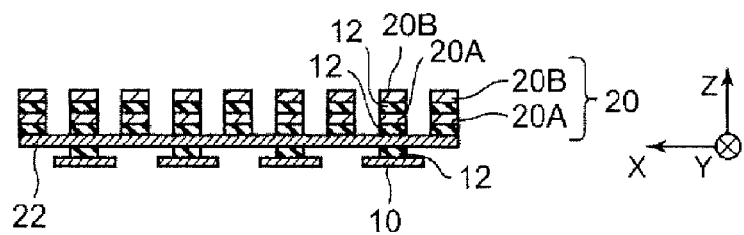

FIG. 23 shows a magnetic sensor 210 according to modification of the seventh embodiment of the present invention, in which FIG. 23A is a top view of the magnetic sensor 210, FIG. 23B is an enlarged top view of a linear portion B of the planar coil 70 shown in FIG. 23A, and FIG. 23C is a cross-sectional view taken along the line 11c-11c of FIG. 23B.

The magnetic sensor 210 has the structure obtained by providing the bias-magnetic-field applying current lines 22 shown in the above-mentioned magnetic sensor 160, between the magnetoresistive effect elements 10 and the first current lines 20A via the insulating layers 12 in the above-mentioned magnetic sensor 140 (note that the insulating layer 12 may be disposed both between the magnetoresistive effect element 10 and the current line 22, and between the current line 20A and the current line 22).

8. Eighth Embodiment

Figure 24A:
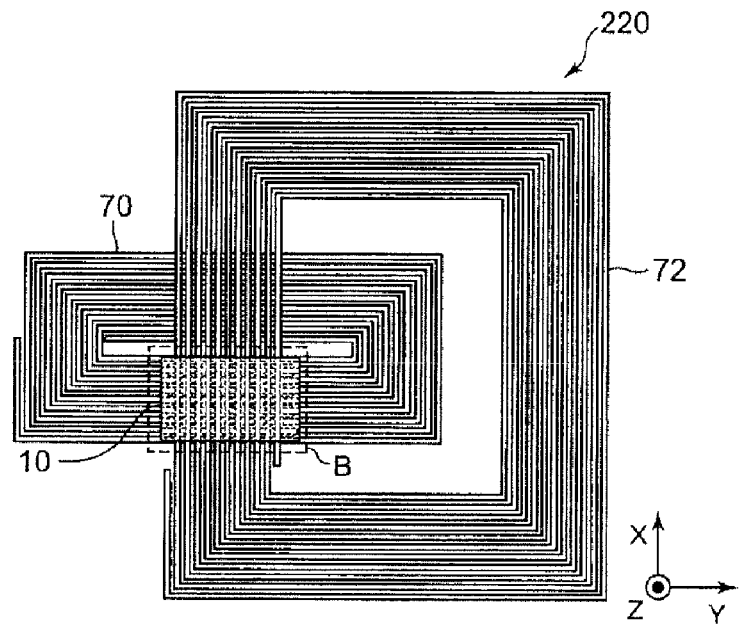
Figure 24B:
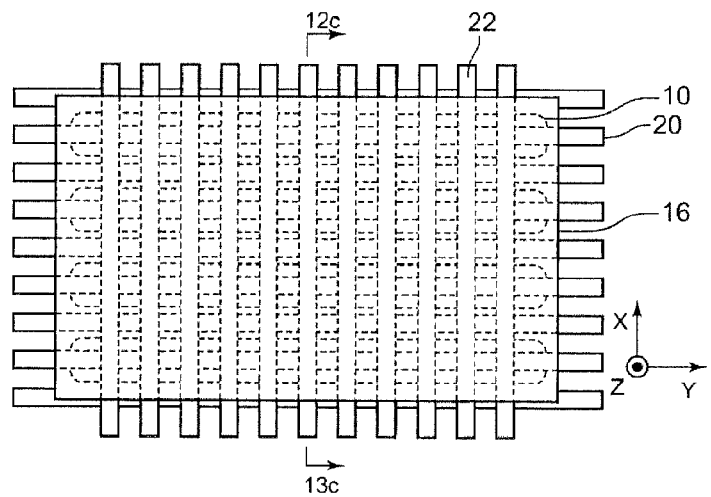
Figure 24C:
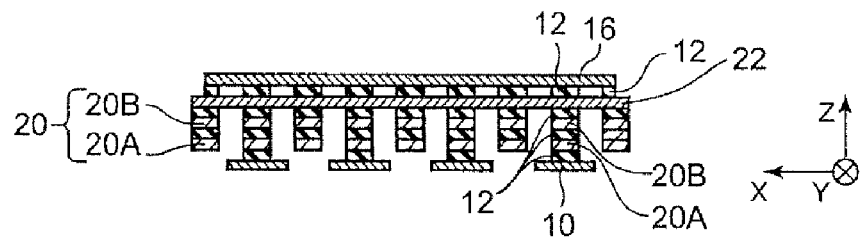

FIG. 24 shows a magnetic sensor 220 according to an eighth embodiment of the present invention, in which FIG. 24A is a top view of the magnetic sensor 220, FIG. 242 is an enlarged top view of a linear portion B of the planar coil 70 shown in FIG. 24A, and FIG. 24C is a cross-sectional view taken along the line 12c-12c of FIG. 24B.

The magnetic sensor 220 has the structure obtained by providing the yoke layer 16 of the above-mentioned magnetic sensor 130, over the bias-magnetic-field applying current lines 22 in the above-mentioned magnetic sensor 200 via the insulating layers 12.

Figure 25A:
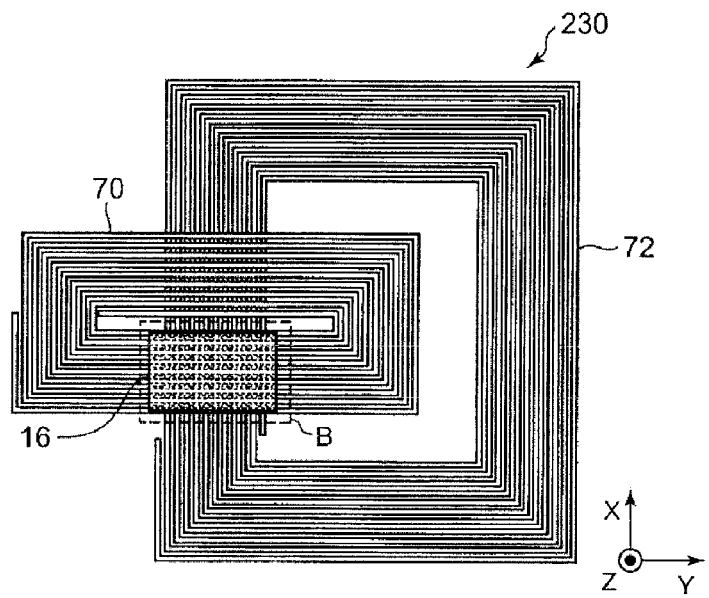
Figure 25B:
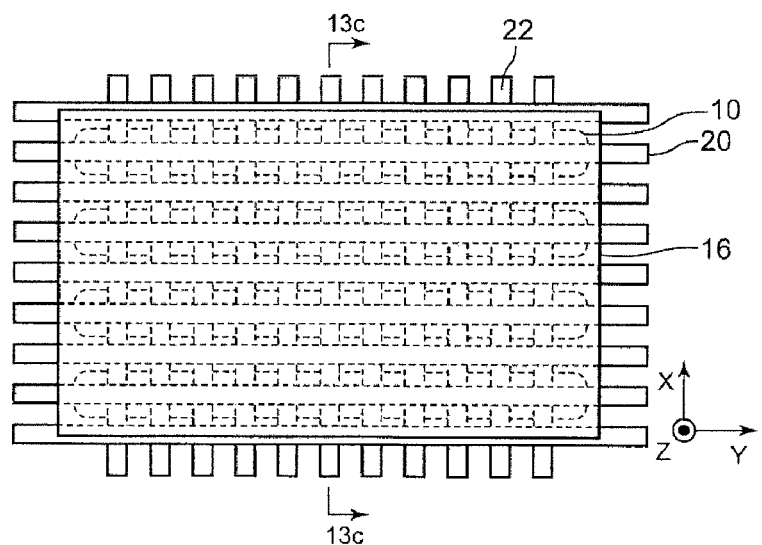
Figure 25C:
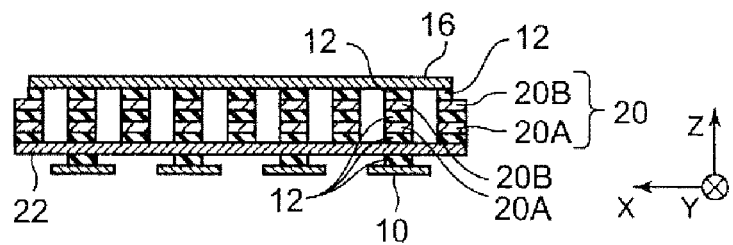

FIG. 25 shows a magnetic sensor 230 according to modification of the eighth embodiment of the present invention, in which FIG. 25A is a top view of the magnetic sensor 230, FIG. 252 is an enlarged top view of a linear portion B of the planar coil 70 shown in FIG. 25A, and FIG. 25C is a cross-sectional view taken along the line 13c-13c of FIG. 25B.

The magnetic sensor 230 has the structure obtained by providing the yoke layer 16 shown in the above-mentioned magnetic sensor 130 over the second current lines 20B in the above-mentioned magnetic sensor 210, via the insulating layers 12.

9. Ninth Embodiment

Figure 26:
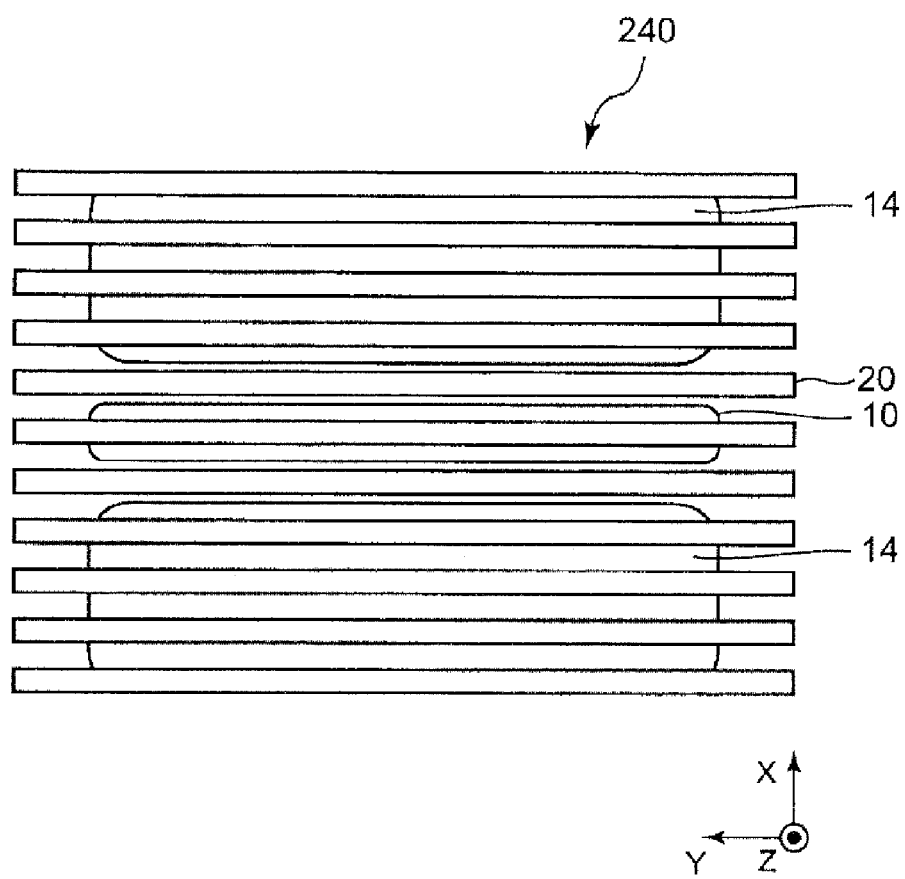
FIG. 26 is a plan view showing a magnetic sensor 240 according to a ninth embodiment of the present invention.

FIG. 26 is a plan view showing a magnetic sensor 240 according to a ninth embodiment of the present invention.

The magnetic sensor 240 includes a second current line 20 with the magnetoresistive effect element 10 disposed thereunder, as well as a first current line (positioned in the X direction from the second current line) and a third current line (positioned in the −X direction from the second current line), which are disposed adjacent to both sides of the current line 20. In addition, the magnetic sensor 240 also includes a current line (fourth current line) 20 positioned outside (in the X direction) the first current line and having a yoke layer 14 disposed thereunder, and a current line (fifth current line) 20 positioned outside (in the −X direction) the third current line and having the yoke layer 14 disposed thereunder.

The fourth current line 20 and the fifth current line 20 extend in parallel to the first current line 20 (that is, also extend in parallel to the second and third current lines).

The fourth current line, the fifth current line, and the yoke layer are arranged in this way, whereby the magnetic field created by the current lines forms the magnetic circuit by means of the yoke layer and the magnetoresistive effect element. Thus, the higher magnetic field can be applied to the magnetoresistive effect element 10 even at the same current.

The fourth current line and the fifth current line are preferably electrically connected in series with the first to third current lines.

The yoke layer 14 includes a soft magnetic material, and is not electrically connected to the first to fifth current lines 20 and the magnetoresistive effect element 10.

The yoke layer 14 may be formed from an alloy film, for example, permalloy, etc. The yoke layer may be a multilayer film including a soft magnetic material layer. As one form of the yoke layer 14 made of the multi-layer film, a magnetoresistive effect element not electrically connected (dummy magnetoresistive effect element) can be exemplified (for example, in FIG. 26, the yoke layer 14 may be the dummy magnetoresistive effect element).

Further, for example, in the magnetic sensor shown in FIG. 3, the magnetoresistive effect elements 10a, 10b, 10d and 10e are not electrically connected and used as the yoke layer 14 (and not used as the magnetoresistive effect element), and only the magnetoresistive effect element 10c may be used as the magnetoresistive effect element.

The structure using the fourth current line, the fifth current line, and the yoke layer may be combined with the structure of one or more of the above-mentioned first to eighth embodiments.

Note that the magnetic sensors 100, 120, 130, 140, 150, 160, 170, 180, 190, 200, 210, 220, 230 and 240 according to the present invention mentioned above can be formed by various known processes, including sputtering, photolithography, etching, plating, etc.

Note that, for example, by connecting both ends of the coil 70 and the magnetoresistive effect element 10 to the magnetic sensor circuit (feedback circuit), the magnetic sensor in the present invention can be used as a magnetic sensor and/or current sensor.

The magnetic sensor circuit may have any existing structure.

Figure 27:
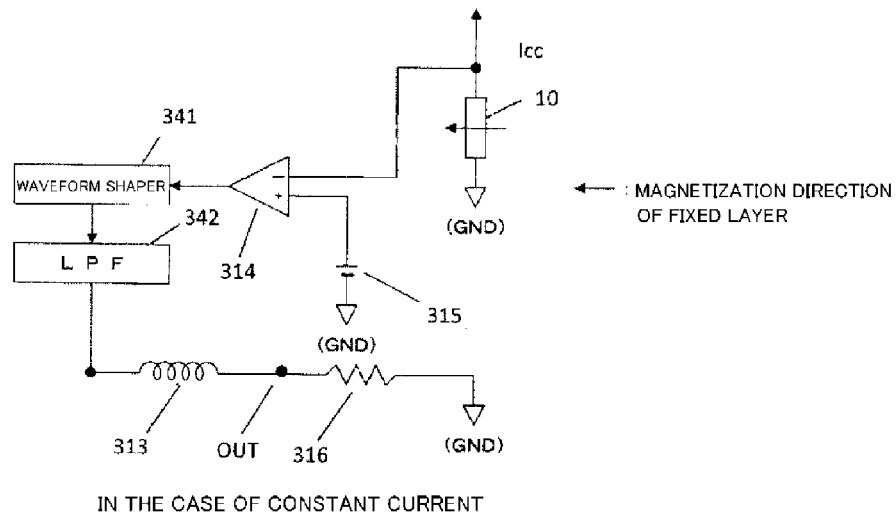
FIG. 27 is a schematic circuit diagram showing an example of a magnetic sensor circuit (feedback circuit).
Figure 27:
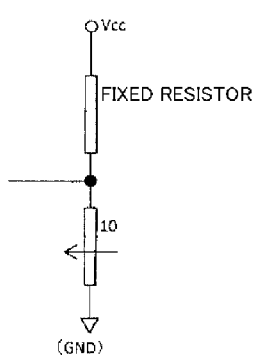
Figure 27:
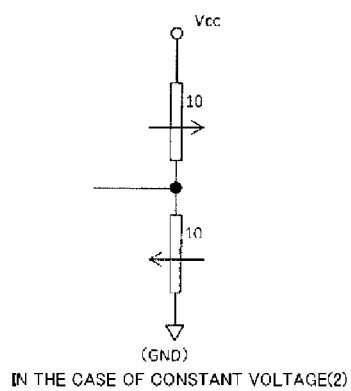

FIG. 27 is a schematic circuit diagram showing an example of the magnetic sensor circuit (feedback circuit).

The magnetic sensor circuit shown in FIG. 27 is the so-called magnetic balance circuit and can be used, for example, as a current sensor. In the magnetic sensor circuit, one end of the magnetoresistive effect element 10 (or two or more magnetoresistive effect elements 10) is connected to receive the current supplied from a DC constant current source Icc or a DC constant voltage source Vcc, and connected to a negative electrode (−) terminal of a comparator 314. The other end of the magnetoresistive effect element 10 is connected a common terminal (GND) via a fixed resistor. When the magnetoresistive effect element 10 includes two kinds of fixed layers having opposite directions, the above-mentioned fixed resistor part becomes one of the two kinds of fixed layers. A positive electrode (+) terminal of the comparator 314 is connected to the common terminal (GND) via a reference power source 315. The output potential of the reference power source 315 is a potential of the magnetoresistive effect element 10 in a position without any magnetic field.

The output of the comparator 314 is connected to one end of a coil 313 via a waveform shaper 341 and a low pass filter (LPF) 342, and also connected to an output terminal OUT. The coil 313 (which serves as the feedback coil 20) has its other end connected to the common terminal (GND) via a fixed resistor 316.

The magnetic sensor including the circuit shown in FIG. 27 obtains the voltage signal output from the magnetoresistive effect element 10 via the comparator 314, the waveform shaper 341 and LPF 342. The output obtained via the LPF 342 becomes a voltage signal that is proportional to a difference between a potential of a reference power source and a potential of the voltage signal output from the magnetoresistive effect element 10.

Here, when the magnetic sensor is positioned in the vicinity of a conductor (for example, a bus bar) through which the current to be measured flows, the resistance of the magnetoresistive effect element 10 changes due to the induced magnetic field generated by the current to be measured. Since its output potential shifts (offsets) from a potential obtained without any magnetic field (the potential being set equal to a reference power source potential as mentioned above), the output obtained through the comparator 314, the waveform shaper 341 and LPF 342 becomes a voltage signal having a level corresponding to the amount of potential shift. The voltage signal represents the strength of the induced magnetic field generated by the current to be measured (current flowing through the bus bar).

The voltage signal is supplied to one end of the coil 313, and the current flowing through the coil 313 generates the feedback magnetic field (canceling magnetic field). The magnetic flux produced by the canceling magnetic field is applied to the magnetoresistive effect element 10, together with the induced magnetic field generated from the current to be measured. When the magnetic flux passing through the magnetoresistive effect element 10 is zero (when the output voltage from the magnetoresistive effect element 10 is the same as a reference potential 315), the voltage signal V proportional to the amount of the current supplied to the coil 313 is taken out as the voltage across the fixed resistor 316 (OUT). Then, the voltage signal V becomes an output signal proportional to the amount of current to be measured (in the above-mentioned example, current flowing through the bus bar).

As illustrated in the "low-voltage case (2)" of FIG. 27, two magnetoresistive effect elements 10 are arranged to have their polarities opposite to each other (that is, such that the magnetization direction of the fixed layers of the magnetoresistive effect elements 10 are opposite to each other) to configure the half-bridge circuit, which can decrease the size of the entire feedback coil (that is, the size of the entire magnetic sensor) and can reduce the resistance. Two detection signals are superimposed on each other to improve the output.

Note that the structure that configures the bridge circuit by electrically connecting two or more magnetoresistive effect elements 10 is not limited thereto, and any existing structure may be used.

Figure 28:
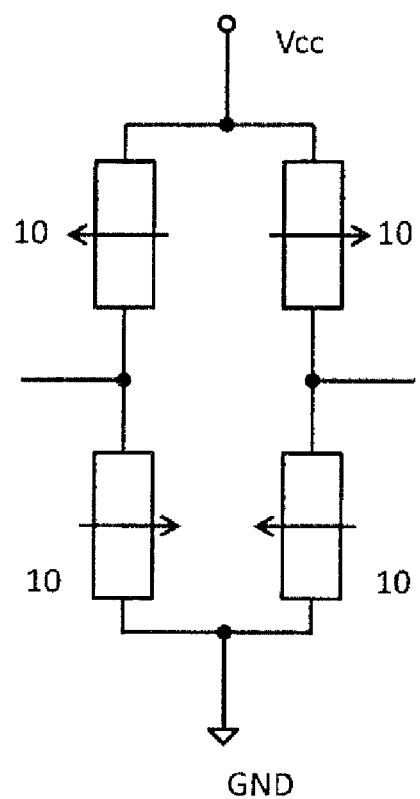
FIG. 28 is a schematic circuit diagram showing an example of the configuration of a full bridge circuit using four magnetoresistive effect elements 10.

FIG. 28 is a schematic circuit diagram showing an example of the configuration of a full-bridge circuit using four magnetoresistive effect elements 10.

As illustrated in FIG. 28, four magnetoresistive effect elements 10 are disposed in one magnetic sensor to configure the full-bridge structure, whereby the magnetoresistive effect elements 10 cancel changes in voltage, such as common mode noise, to improve the measurement accuracy.

In such a case, the two magnetoresistive effect elements 10 are disposed at one current line of the feedback coil along the direction in which the current of the current line flows. Thus, the number of turns of the feedback coil can be lessened as compared to the arrangement of one magnetoresistive effect element 10 at the one current line. This can result in a shortened length of the feedback coil, reducing the resistance of the feedback coil, whereby the feedback voltage can be decreased, allowing the magnetoresistive effect elements to operate at a low voltage.

Further, the magnetoresistive effect elements 10 are arranged taking into consideration the direction of the magnetosensitive axis, which can also be expected to cancel the magnetic noise. For example, when the full-bridge circuit is comprised of two half-bridge circuits, the half-bridges are disposed in positions where the directions of the respective induced magnetic fields generated by the same current line are opposite to each other, which cancels noise due to the uniform external magnetic field.

Note that as mentioned above, the full-bridge circuit is configured by four or more magnetoresistive effect elements 10, but alternatively may be configured, for example, by three magnetoresistive effect elements 10.

EXAMPLES

Next, samples of examples including the structures of the feedback coil and the bias coil according to the above-mentioned fourth, seventh and eighth embodiments were fabricated and evaluated by a detection efficiency, which was the strength of the magnetic field detected per the power consumption of 1 mA.

The details of evaluation will be shown below.

Table 1 shows the details of the fabricated samples and the obtained results of detection efficiencies of the samples.

TABLE 1

| Sample No. | Embodiment | Figure | Configuration | $L_s/W_g$ | Maximum FB current | Detection efficiency per FB current |
|---|---|---|---|---|---|---|
| 1 | 7 | 22 | FB/FB/Bias | 4 | 13.6 mA | 1.7 Oe/mA |
| 2 | 7 | 22 | FB/FB/Bias | 2 | 13.7 mA | 1.5 Oe/mA |
| 3 | 4 | 18 | Bias/FB | 4 | 19.3 mA | 0.8 Oe/mA |
| 4 | 4 | 18 | Bias/FB | 2.67 | 19.7 mA | 0.7 Oe/mA |
| 5 | 4 | 18 | Bias/FB | 2 | 19.6 mA | 0.7 Oe/mA |
| 6 | 4 | 17 | FB/Bias | 4 | 19.6 mA | 0.9 Oe/mA |
| 7 | 4 | 17 | FB/Bias | 2.67 | 19.6 mA | 0.8 Oe/mA |
| 8 | 4 | 17 | FB/Bias | 2 | 19.3 mA | 0.8 Oe/mA |
| 9 | 8 | 24 | FB/FB/Bias/NiFe | 2 | 11.25 mA | 4.4 Oe/mA |
| 10 | 8 | 25 | Bias/FB/FB/NiFe | 2 | 11.33 mA | 4.4 Oe/mA |
| 11 | 7 | 22 | FB/FB/Bias | 2 | 15.2 mA | 1.4 Oe/mA |
| 12 | 7 | 23 | Bias/FB/FB | 2 | 15 mA | 1.4 Oe/mA |
| Comparative Example | Comparative Example | — | FB | 16.5 | 20 mA | 0.5 Oe/mA |

The term "FB" means a feedback coil; the term "Bias", a bias coil; and the term "NiFe", a yoke layer.

Table 1 shows the embodiments corresponding to the respective samples. It is noted that this only indicates the embodiment closest to each sample, which does not mean that components of any embodiment other than the embodiments mentioned in Table 1 are not satisfied.

Further, the column "Figure" mentions the figure indicative of the substantially same structure as that of each sample, more specifically, the order of lamination of a feedback coil, a bias coil, and a yoke layer (only if it exists).

Note that in the column "Figure", one of the feedback coil, the bias coil, and the yoke layer (only if it exists) that is positioned at the lowest level (or closest to the magnetoresistive effect element 10) is mentioned on the left side. The feedback coil, the bias coil and the yoke layer, which are laminated, are illustrated from the left to right sides of the table in the order of lamination.

Figure 29:
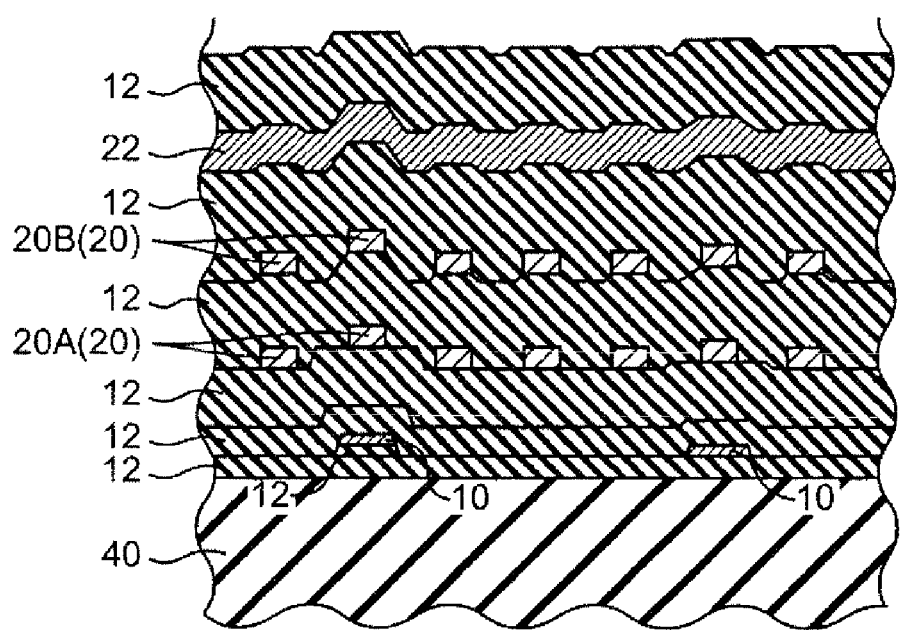
FIG. 29 is a cross-sectional view showing the section of a sample 1 in Examples.
Figure 29:
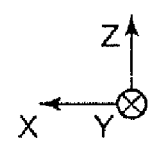

FIG. 29 is a cross-sectional view showing the section of a sample 1 in the example. The section of FIG. 29 is a section corresponding to FIG. 22C, that is, a section corresponding to the section taken along the line 10c-10c of FIG. 22B.

Referring to FIG. 29, the details of the sample in the example will be described below. It is noted that any dimensions described below are designed values (target values), and the actual dimensions can slightly deviate from the designed values due to issues in accuracy of the manufacture process as long as they are useful for confirming the effects of the present invention.

Any sample was non-magnetic, and thus was formed on a substrate 40 made of silicon. Specifically, two magnetoresistive effect elements 10 were arranged on the insulating layer 12 of $SiO_2$, which was formed by oxidizing the surface of the substrate 40. The magnetoresistive effect element 10 used was an SVGMR element with a GMR magnetosensitive film (SVGMR magnetosensitive film). Note that as can be seen from FIG. 29, after forming another insulating layer 12 of 0.03 μm in thickness on the above-mentioned insulating layer 12 of $SiO_2$, one of the two magnetoresistive effect elements 10 (on the left side of FIG. 29) was formed on this insulating layer 12 of 0.03 μm in thickness. The width (the length in the X direction) $W_g$ of the GMR magnetosensitive film in the magnetoresistive effect element 10 of each sample was selected such that each $L_s/W_g$ satisfies the conditions shown in Table 1 as appropriate. The length (the length in the Y direction) of the GMR magnetosensitive film in the magnetoresistive effect element 10 of each sample was selected according to its width to have the constant electric resistance under all conditions.

Another insulating layer 12 of 0.2 μm in thickness was formed to cover the two magnetoresistive effect elements 10, and thereafter a further insulating layer 12 of 1.3 μm in thickness was formed thereon.

Further, over the insulating layer 12, the feedback coil and the bias coil, and further the yoke layer if shown in Table 1 were formed in the order indicated in the column "configuration" of Table 1.

In any sample of the example, the feedback coil was comprised of the planar coil with seven turns. In one feedback coil, seven current lines 20 were formed on the section shown in FIG. 29.

The width $W_p$ of the current line 20 was 4 μm (note that, for example, the width can be determined by measuring a distance between the ends of the current line in the top view). The distance $d_2$ between the adjacent current lines 20 was 4 μm. The thickness of the current line 20 was 0.8 μm.

Thus, the length $L_3$ from the outside of the first current line to the outside of the above-mentioned third current line was set to 20 μm.

In any sample of the example, the bias coil was comprised of the planar coil with 16 turns. The current line 22 had its width of 4 μm. The distance between the adjacent current lines 22 was set to 4 μm, and the thickness of each current line 22 was set to 0.8 μm.

The feedback coil, the bias coil and the wiring were formed using Al—Cu by sputtering.

In the case of providing the yoke layer, the yoke layer having a width of 52 μm, a length of 138 μm and a thickness of 1 μm was formed using Ni—Fe by plating.

When laminating any of the feedback coil, the bias coil and the yoke layer, and further forming another feedback coil, bias coil and yoke layer thereover, an insulating layer 12 of 1.3 μm in thickness was provided therebetween. Further, another insulating layer 12 of 1.3 μm in thickness was provided on the uppermost layer which was one of the feedback coil, the bias coil and the yoke layer.

Thus, in sample 1 shown in FIG. 29, an insulating layer 12 of 1.3 μm in thickness was formed on first current lines 20A, which were the current lines of the first feedback coil. On the insulating layer 12, second current lines 20B were formed as the current lines of the second feedback coil. Then, on the second current lines 20B, another insulating layer 12 was formed. On the insulating layer 12, current lines 22 of the bias coil were formed. Further, another insulating layer 12 was formed on the current lines 22.

Note that the insulating layer 12 used in the samples of the examples was formed by appropriately selecting one of the group consisting of a $SiO_2$ film, an $Al_2O_3$ film and a hard bake resist.

The respective samples 1 to 18 of the examples fabricated in this way were subjected to the magnetic field with the bias current flowing therethrough. The maximum current required for the feedback in each sample was measured by defining a range of the current linearly output with respect to the magnetic field, as an operating range. The thus-obtained maximum feedback current (maximum FB current shown in Table 1) was shown in Table 1.

A sample as a comparative example was fabricated under the conditions that did not satisfy the following relationship: $L_s/W_g \leq 5$. Then, the fabricated comparative sample was compared with the examples mentioned above. The maximum feedback current (maximum FB current shown in Table 1) was shown in Table 1.

The comparison on the current consumption between the examples and the comparative example was made based on the detection efficiency of the amount of current required for the feedback in the operating range. More specifically, a value obtained by dividing the strength of a magnetic field in the half range of the operating range by the maximum feedback current by use of the equation below was determined as the detection efficiency.

Detection Efficiency=(Operating Range/2)/Maximum Feedback Current

As shown in Table 1, it was confirmed that the examples of the present invention had the higher detection efficiency for the feedback current and the lower current consumption, as compared to the comparative example. Further, it was found that by providing the yoke layer, the detection efficiency was improved further.

DESCRIPTION OF REFERENCE NUMERALS

10 Magnetoresistive effect element
12 Insulating layer
14, 16 Yoke layer
20 Current line
20A First current line
20B Second current line
20C Third current line
22 Bias-magnetic-field applying current line
36, 38 Central line
70, 72 Planar coil
100, 120, 130, 140, 150, 160, 170, 180, 190, 200, 210, 220, 230, 240 Magnetic sensor

The invention claimed is:
1. A magnetic sensor comprising:
a first current line, a second current line and a third current line that are disposed in parallel to each other in sequence in a width direction and electrically connected in series; and
a magnetoresistive effect element disposed under the second current line and extending along a direction of extension of the second current line, the magnetoresistive effect element having an electric resistance that changes by an induced magnetic field generated by current flowing through the first current line, the second current line and the third current line, the following inequality expression (1) being satisfied:

$$L_s/W_g \leq 5 \quad (1)$$

where $L_s$ is a length from an outside of the first current line to an outside of the third current line in a width direction, and $W_g$ is a length in the width direction of the magnetoresistive effect element.

2. The magnetic sensor according to claim 1, wherein following inequality expression (2) is satisfied:

$$W_p \leq W_g \quad (2)$$

where $W_p$ is a length in the width direction of the second current line, and $W_g$ is the length in the width direction of the magnetoresistive effect element.

3. The magnetic sensor according to claim 2, wherein a plurality of magnetoresistive effect elements is disposed under the second current line.

4. The magnetic sensor according to claim 1, wherein a plurality of magnetoresistive effect elements is disposed under the second current line.

5. The magnetic sensor according to claim 1, wherein the first current line, the second current line and the third current line are parts of a planar coil.

6. The magnetic sensor according to claim 1, wherein a yoke layer is disposed over the first current line, the second current line and the third current line to cover the first current line, the second current line and the third current line.

7. The magnetic sensor according to claim 1, wherein each of the first current line, the second current line and the third current line is formed vertically in two or more layers.

8. The magnetic sensor according to claim 1, further comprising a plurality of bias-magnetic-field applying current lines extending in a direction vertical to the direction of extension of the second current line, the bias-magnetic-field applying current lines being adapted to apply a bias magnetic field to the magnetoresistive effect element by an induced magnetic field generated by a flowing current.

9. The magnetic sensor according to claim 8, wherein the plurality of bias-magnetic-field applying current lines is disposed above the first current line, the second current line and the third current line.

10. The magnetic sensor according to claim 8, wherein the plurality of bias-magnetic-field applying current lines is disposed between the second current line and the magnetoresistive effect element.

11. The magnetic sensor according to claim 8, wherein the plurality of bias-magnetic-field applying current lines is disposed below the first current line, the second current line and the third current line.

12. The magnetic sensor according to claim 1, wherein the magnetoresistive effect element is a spin valve giant magnetoresistive effect element.

13. The magnetic sensor according to claim 1, further comprising:
a fourth current line extending in parallel to the first current line and disposed outside the first current line;
a fifth current line extending in parallel to the third current line and disposed outside the third current line;
a first yoke layer disposed below the fourth current line, containing a soft magnetic material, and not electrically connected to the first to fifth current lines and the magnetoresistive effect element; and
a second yoke layer disposed below the fifth current line, containing a soft magnetic material, and not electrically connected to the first to fifth current lines and the magnetoresistive effect element.

14. The magnetic sensor according to claim 1, wherein the two or more magnetoresistive effect elements are disposed to be electrically connected together so as to form a bridge circuit.

15. The magnetic sensor according to claim 14, wherein the bridge circuit is a half-bridge circuit.

16. The magnetic sensor according to claim 14, wherein the bridge circuit is a full bridge circuit.

* * * * *